(12) United States Patent
Ohta et al.

(10) Patent No.: US 7,560,998 B2
(45) Date of Patent: Jul. 14, 2009

(54) CLOCK SIGNAL OUTPUT CIRCUIT

(75) Inventors: Norikazu Ohta, Aichi-gun (JP); Yoshie Ohira, Nagoya (JP); Yasuaki Makino, Okazaki (JP); Hiromi Ariyoshi, Kariya (JP)

(73) Assignees: Kabushiki Kaisha Toyoto Chuo Kenkyusho, Aichi-Gun (JP); Denso Corporation, Kariya (JP)

( * ) Notice: Subject to any disclaimer, the term of this patent is extended or adjusted under 35 U.S.C. 154(b) by 113 days.

(21) Appl. No.: 11/604,198

(22) Filed: Nov. 27, 2006

(65) Prior Publication Data

US 2007/0146072 A1    Jun. 28, 2007

(30) Foreign Application Priority Data

Nov. 28, 2005  (JP) ............................. 2005-342416
Sep. 25, 2006  (JP) ............................. 2006-259461

(51) Int. Cl.
*H03K 3/03*     (2006.01)
*H03L 1/00*     (2006.01)

(52) U.S. Cl. .......................... 331/57; 331/176; 331/185; 331/186

(58) Field of Classification Search .................... 331/57, 331/175, 176, 185, 186
See application file for complete search history.

(56) References Cited

U.S. PATENT DOCUMENTS 4,547,749 A    10/1985  Kuo
4,893,095 A *  1/1990  Thommen ..................... 331/57
5,028,888 A *  7/1991  Ray ............................. 331/57
5,180,995 A    1/1993  Hayashi et al.
6,809,603 B1 * 10/2004 Ho ............................... 331/57
7,154,352 B2 * 12/2006 Smith et al. ................. 331/185

FOREIGN PATENT DOCUMENTS

| EP | 0 304 975 A1 | 3/1989 |
|----|---|---|
| JP | A 2003-198333 | 7/2003 |
| JP | A-2003-283305 | 10/2003 |
| JP | A 2003-283305 | 10/2003 |

\* cited by examiner

*Primary Examiner*—Robert Pascal
*Assistant Examiner*—Levi Gannon
(74) *Attorney, Agent, or Firm*—Oliff & Berridge, PLC

(57) ABSTRACT

$1^{st}$ to $n^{th}$ pairs of transistors (n=an odd number) are connected in parallel, and each pair of transistors has an upper transistor and a lower transistor connected in series. A point between the upper transistor and the lower transistor of a preceding pair of transistors is connected to a gate of the lower transistor of a subsequent transistor, and the point between the upper transistor and the lower transistor of $n^{th}$ pair of transistors is connected to the gate of the first lower transistor. A capacitor is inserted between the lower transistor and a direct power source. A current regulating circuit connected to gates of the upper transistors, wherein the current regulating circuit supplies a gate voltage to each gate of the each upper transistor. The magnitude of the gate voltage is adjusted such that a magnitude of current that flows between the source and drain of the upper transistor due to the gate voltage is proportional to a voltage between the source and gate of the corresponding lower transistor when the lower transistor is turned on.

6 Claims, 11 Drawing Sheets

FIG. 3a
RELATED ART
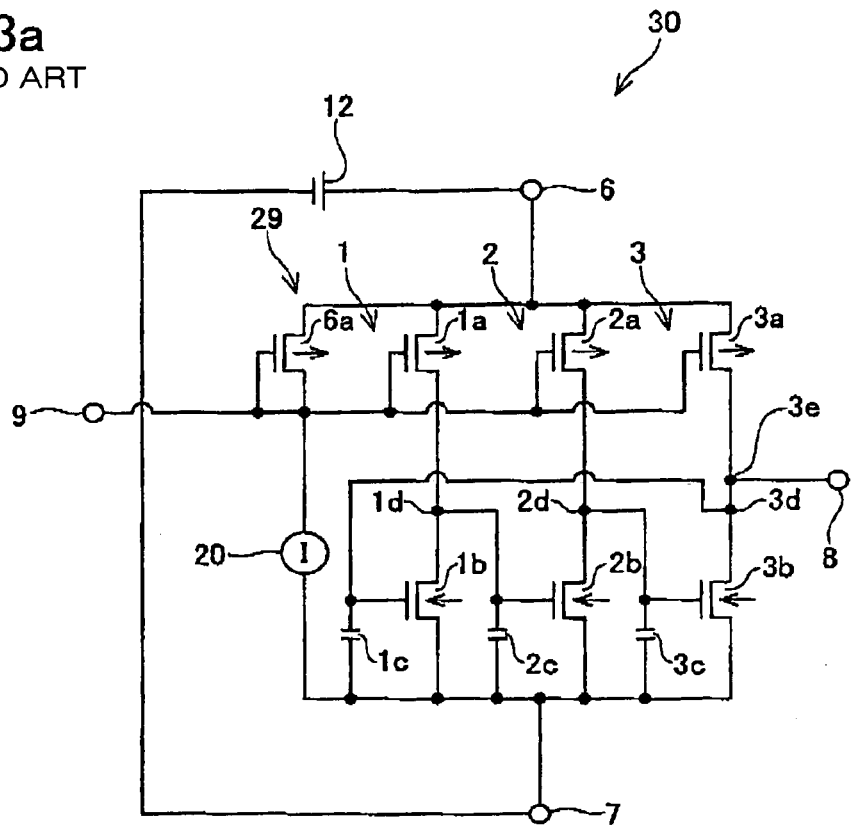
FIG. 3b
RELATED ART
FIG. 3c
RELATED ART
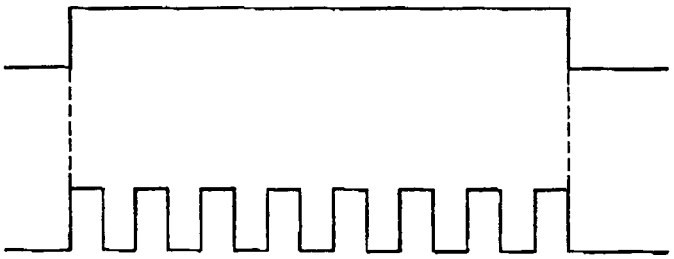

US 7,560,998 B2

CLOCK SIGNAL OUTPUT CIRCUIT

CROSS REFERENCE TO RELATED APPLICATION

The present application claims priority based on Japanese Patent Application No. 2005-342416 filed on 28th Nov. 2005 and Japanese Patent Application No. 2006-259461 filed on 25th Sep. 2006. The contents of these Japanese applications are hereby incorporated by reference in to the present application.

BACKGROUND OF THE INVENTION

1. Field of the Invention

The present invention relates to a circuit for outputting clock signal with a predetermined frequency regardless of variations in the environmental temperature or voltage of a direct power source which supplies power to the circuit.

2. Description of the Related Art

Clock signal guaranteed to have a fixed frequency are required to enable accurate timing measurements. To this end, development of a circuit for outputting clock signal with the fixed frequency is under way. This type of clock signal output circuit is required to be capable of maintaining oscillating frequency of clock signal at constant level.

An oscillating circuit for oscillating clock signal that is referred to as a ring oscillator is known. FIG. 3a shows a conventional ring oscillator circuit 30 (one example of the clock signal output circuit) that has been improved to stabilize oscillating frequency. This ring oscillator circuit 30 is disclosed in Japanese Patent Application Laid-Open Publication No. 2003-283305. The ring oscillator circuit 30 comprises a first terminal 6 connected to a positive pole of a direct power source 12, a second terminal 7 connected to a negative pole of the direct power source 12, and a third terminal 8 for outputting clock signal. Between the first terminal 6 and the second terminal 7 are connected in parallel an odd number (3 pairs in FIG. 3a) of $1^{st}$ pair of transistors, $2^{nd}$ pair of transistors, and $3^{rd}$ pair of transistors. In the $1^{st}$ pair of transistors 1, an upper transistor 1a and a lower transistor 1b are connected in series. In the $2^{nd}$ pair of transistors 2, an upper transistor 2a and a lower transistor 2b are connected in series. In the $3^{rd}$ pair of transistors 3, an upper transistor 3a and a lower transistor 3b are connected in series. A midpoint 1d between the upper transistor 1a and the lower transistor 1b of the $1^{st}$ pair of transistors 1 is connected to a gate of the lower transistor 2b of the $2^{nd}$ pair of transistors 2. A midpoint 2d between the upper transistor 2a and the lower transistor 2b of the $2^{nd}$ pair of transistors 2 is connected to a gate of the lower transistor 3b of the $3^{rd}$ pair of transistors 3. A midpoint 3d of the upper transistor 3a and the lower transistor 3b of the $3^{rd}$ pair of transistors 3 is connected to a gate of the lower transistor 1b of the $1^{st}$ pair of transistors 1. A capacitor 1c is inserted between the gate of the lower transistor 1b of the $1^{st}$ pair of transistors 1 and the second terminal 7. A capacitor 2c is inserted between the gate of the lower transistor 2b of the $2^{nd}$ pair of transistors 2 and the second terminal 7. A capacitor 3c is inserted between the lower transistor 3b of the $3^{rd}$ pair of transistors 3 and the second terminal 7. The third terminal 8 is connected to a midpoint 3e of the upper transistor 3a and the lower transistor 3b of the $3^{rd}$ pair of transistors 3.

All of the upper transistors 1a, 2a, 3a are of a p-type transistor and have same specification. All of the lower transistors 1b, 2b, 3b are of a n-type transistor and have same specification. The capacitors 1c, 2c, 3c have same specification.

The ring oscillator circuit 30 comprises a constant current circuit 29 that maintains at constant level current IP flowing through the upper transistors 1a, 2a, and 3a even when supply voltage of the direct power source 12 fluctuates. The constant current circuit 29 comprises an additional upper transistor 6a, and a constant current regulator 20. The additional upper transistor 6a and the constant current regulator 20 are connected in series between the first terminal 6 and the second terminal 7. In the additional upper transistor 6a, a gate and a drain are connected. A midpoint between the additional upper transistor 6a and the constant current regulator 20 is connected to each gate of the upper transistors 1a, 2a, 3a.

As shown in FIG. 3b and FIG. 3c, the ring oscillator circuit 30 outputs clock signal (shown in FIG. 3c) that repeat on/off inversions with certain frequency to the third terminal 8, while gate-on voltage (shown in FIG. 3b) is being inputted to the gate of the additional upper transistor 6a from a terminal 9.

FIG. 4 shows a relationship of voltage of the capacitors 1c, 2c, 3c and temporal change. $V_T$ represents gate voltage (threshold voltage) when the lower transistors (n-type transistors) 1b, 2b, 3b are turned on. $t_r$ represents time taken to charge the discharged capacitors 1c, 2c, 3c to the threshold voltage $V_T$. $t_f$ represents time since the charged capacitors 1c, 2c, 3c begin to discharge till voltage of the capacitors 1c, 2c, 3c drops to the threshold voltage $V_T$. $V_H$ represents voltage when each of the capacitors 1c, 2c, 3c begins to discharge.

The ring oscillator circuit 30 operates as described below. For instance, immediately before timing $t_0$, only the transistor 2b is on, and the transistor 1b and the transistor 3b are off. As the transistor 2b is on, the capacitor 3c is discharged. As the transistor 3b is off, the capacitor 1c is being charged. As the transistor 1b is off, the capacitor 2c is being charged.

At timing $t_0$, when voltage of the capacitor 1c becomes equal to the threshold voltage $V_T$ of the transistor 1b, the transistor 1b is turned on. As a result, the capacitor 2c begins to discharge. The transistor 2b will be turned off $t_f$ time after timing $t_0$. When the transistor 2b is turned off, the capacitor 3c begins to charge.

At timing $t_1$, when voltage of the capacitor 3c becomes equal to the threshold voltage $V_T$ of the transistor 3b, the transistor 3b is turned on. As a result, the capacitor 1c begins to discharge. The transistor 1b will be turned off $t_f$ time after the timing $t_1$. When the transistor 1b is turned off, the capacitor 2c begins to charge.

At timing $t_2$, when voltage of the capacitor 2c becomes equal to the threshold voltage $V_T$, of the transistor 2b the transistor 2b is turned on. As a result, the capacitor 3c begins to discharge. The transistor 3b will be turned off $t_f$ time after the timing $t_2$. When the transistor 3b is turned off, the capacitor 1c begins to discharge.

At timing $t_3$, when voltage of the capacitor 1c becomes equal to the threshold voltage $V_T$ of the transistor 1b, the transistor 1b is turned on. As a result, the capacitor 2c begins to discharge. The transistor 2b will be turned off $t_f$ time after the timing $t_3$. When the transistor 2b is turned off, the capacitor 3c begins to charge. This event is equal to that at timing $t_0$. Consequently same phenomenon occurs at timings $t_4$ and $t_1$, and at timing $t_5$ and $t_2$.

With the ring oscillator circuit 30, the transistor 1b repeats action of turning on at the timing $t_0$ and turning off at $t_1 + t_f$. The transistor 2b repeats action of turning on at timing $t_2$ and turning off at $t_3 + t_f$. The transistor 3b repeats action of turning on at timing $t_1$ and turning off at $t_2 + t_f$.

With the ring oscillator circuit 30 of FIG. 3a, the constant current regulator 20 maintains current flowing through the upper transistor 6a at constant current IP.

In the ring oscillator circuit 30 of FIG. 3a, the constant current circuit 29 comprising the additional upper transistor 6a and the constant current regulator 20 configures a current mirror circuit to the $1^{st}$ pair of transistors 1. As a result, gate voltage to be applied to the additional upper transistor 6a is equal to gate voltage to be applied to the upper transistor 1a, current IP flowing through the additional upper transistor 6a is equal to current flowing through the upper transistor 1a. Similarly, the constant current circuit 29 configures a current mirror circuit to the $2^{nd}$ pair of transistors 2. Gate voltage to be applied to the additional upper transistor 6a is equal to gate voltage to be applied to the upper transistor 2a, and current IP flowing through the additional upper transistor 6a is equal to current flowing through the upper transistor 2a. In addition, the constant current circuit 29 configures a current mirror circuit to the $3^{rd}$ pair of transistors 3. Gate voltage to be applied to the additional upper transistor 6a is equal to gate voltage to be applied to the upper transistor 3a, and current IP flowing through the additional upper transistor 6a is equal to current flowing through the upper transistor 3a. In the ring oscillator circuit 30 of FIG. 3a, voltage equal to the voltage to be applied to the gate of the additional upper transistor 6a is applied to gates of the respective upper transistors 1a, 2a, 3a. As a result, the current flowing through the respective upper transistors 1a, 2a, 3a is maintained at the constant current IP.

The vertical axis of FIG. 2 represents oscillating frequency, while the horizontal axis represents environmental temperature. Curves 21a, 21b, 21c show a relationship between oscillating frequency of the ring oscillator circuit 30 and the environmental temperatures. The curve 21a shows the case in which voltage of the direct current source 12 is 3.6 volts, the curve 21b shows the case that voltage of the direct current source 12 is 3.3 volts, and the curve 21c shows the case that voltage of the direct current source 12 is 3.0 volts. In the ring oscillator circuit 30 of FIG. 3a, even if the source voltage fluctuates, the oscillating frequency does not change much

BRIEF SUMMARY OF THE INVENTION

As can be seen from the curves 21a, 21b, 21c of FIG. 2, in the ring oscillator circuit 30 of FIG. 3a, the current IP flowing through the upper transistors 1a, 2a, 3a can be maintained at a constant level, by action of the constant current circuit 29. Then, even when supply voltage of the direct power source 12 fluctuates, the oscillating frequency can be maintained approximately constant.

However, as can be seen from the curves 21a, 21b, 21c are inclined, the oscillating frequency considerably fluctuates when environmental temperature changes.

Hence, the present invention implements a circuit whereby not only the oscillating frequency can be maintained at constant level even when supply voltage fluctuates, but also the oscillating frequency can be maintained at constant level even when environmental temperature changes.

The inventor has studied what causes oscillating frequency to change. In the following, the causes are described.

When the oscillating frequency of the ring oscillator circuit is signified by f, the following formulas (1), (2), (3) can be obtained for the parameters described in FIG. 4.

[Formula 1] \hfill (1)
$$tr = \frac{CD \times V_T}{IP}$$

-continued

[Formula 2] \hfill (2)
$$V_H = \frac{(2t_r + t_f) \times IP}{CD}$$

[Formula 3] \hfill (3)
$$f = \frac{1}{3 \times (t_r + t_f)}$$

In the above formulas, IP represents a value of the current flowing the respective upper transistors 1a, 2a, 3a, and CD represents electrostatic capacitance of the capacitors.

If it is assumed that $t_r >> t_f$ in the formulas (1), (2), (3), the following formula (4) can be obtained.

[Formula 4] \hfill (4)
$$f \approx \frac{1}{3 \times t_r} = \frac{IP}{3 \times CD \times V_T}$$

It can be seen that the oscillating frequency of the ring oscillator changes, as shown in formula (4), depending on the current IP flowing through the upper transistors 1a, 2a, 3a and also on the threshold voltage $V_T$ of the lower transistors 1b, 2b, 3b. In general, the current IP flowing through the upper transistors 1a, 2a, 3a changes as voltage of the direct power source 12 varies. In the conventional ring oscillator circuit 30 as shown in FIG. 3, any change in the oscillating frequency due to the voltage variation of the direct power source 12 is controlled as the constant current circuit 29 that maintains the current IP flowing through the upper transistors 1a, 2a, 3a at constant level is attached.

However, as shown in formula (4), the oscillating frequency of the ring oscillator circuit changes as the threshold voltage $V_T$ of the lower transistors 1b, 2b, 3b varies. The threshold voltage $V_T$ of the lower transistors 1b, 2b, 3b changes as the environmental temperature varies. As a result, in the conventional ring oscillator circuit 30 shown in FIG. 3, the oscillating frequency changes together with variations of the environmental temperature.

As a result of the research by the inventor, the knowledge was obtained that if the event that the threshold voltage $V_T$ of the lower transistors 1b, 2b, 3b changes, accompanying variations in the environmental temperature could be compensated, the event that the oscillating frequency changes, accompanying variations in the environmental temperature could be controlled. The present invention leverages the knowledge.

A clock signal output circuit of the present invention comprises a first terminal to be connected to one electrode of the direct power source, a second terminal to be connected to other electrode of the direct power source, and a third terminal for outputting clock signal. Further, between the first and second terminals, it also comprises a parallel circuit in which $1^{st}$ to $n^{th}$ (n=an odd number) pairs of transistors are connected in parallel. In the following, a pair of transistors having a younger number precedes the pair of transistors having an older number, and a pair of transistors having an older number than the preceding pair of transistors shall be a subsequent pair of transistors. However, a pair of transistors having the oldest number (i.e., the $n^{th}$ pair of transistors) precedes the $1^{st}$ pair of transistors.

In each pair of transistors, an upper transistor and a lower transistor are connected in series. A midpoint between the upper transistor and the lower transistor of the preceding pair of transistors is connected to a gate of the lower transistor of the subsequent pair of transistors. A midpoint between the upper transistor and the lower transistor of the $n^{th}$ (n=the largest number) pair of transistors is connected to the gate of the $1^{st}$ (the youngest number) pair of transistors. The midpoint between the upper transistor and the lower transistor of one pair of transistors is connected to the third terminal. Further, a capacitor is inserted between the gate of the lower transistor of the respective pair of transistors and the second terminal.

The upper transistors of the pairs of transistors have same specification, the lower transistors of the pairs of transistors have same specification, and the capacitor of the pairs of transistors have same specification.

Besides, the clock signal output circuit comprises a current regulating circuit. The current regulating circuit is connected to the gates of the upper transistors of the pairs of transistors. In addition, the current regulating circuit supplies a gate voltage to each gate of each upper transistor. The magnitude of the gate voltage is adjusted to satisfy the following conditions:
(1) when the gate voltage is applied to the gate of the upper transistor, a current flows between the source and drain of the upper transistor. The magnitude of the current shall be the upper transistor current.
(2) When a voltage applied between the source and gate of the corresponding lower transistor is increased, the lower transistor is turned on at a certain voltage. This voltage shall be the threshold voltage of the lower transistor.

The magnitude of the gate voltage is adjusted so that the upper transistor current is proportional to the threshold voltage of the lower transistor.

In the following, the "gate-source voltage of the lower transistor when the lower transistor is turned on" may be expressed as the "threshold voltage $V_T$ of the lower transistor". The threshold voltage $V_T$ of the lower transistor changes due to variation in the environmental temperature. The threshold voltage $V_T$ used herein should be interpreted in the broad sense, adding that it varies due to the environmental temperature. Therefore, the "threshold voltage $V_T$ of the lower transistor" may show a different value if the environmental temperature differs.

In the above clock signal output circuit, current proportional to the gate-source voltage (threshold voltage $V_T$) of the lower transistor when the lower transistor is turned on flows through the respective upper transistor of respective pair of transistors. Namely, the following formula (5) can be established between the current IP flowing through the respective upper transistor and the threshold voltage $V_T$ of the respective lower transistor of the respective pair of transistors.

[Formula 5]

$$IP = d \times V_T \quad (5)$$

Where d is a proportional constant.

If this is introduced into the formula (4), the following formula (6) can be obtained.

[Formula 6]

$$f \approx \frac{d \times V_T}{3 \times CD \times V_T} = \frac{d}{3 \times CD} \quad (6)$$

As shown in the formula (6), the effect on the oscillating frequency f of the current IP flowing through the respective upper transistor of the respective pair of transistors counteracts the effect on the oscillating frequency f of the threshold voltage $V_T$ of the corresponding lower transistor, and thus the oscillating frequency f can be maintained constantly. With the clock signal output circuit of the present invention, even when supply voltage and/or environmental temperature varies, the oscillating frequency f does not change in theory. In reality, as well, change in the oscillating frequency f can be remarkably controlled.

BRIEF DESCRIPTION OF THE DRAWINGS

FIG. 3a shows a conventional clock signal output circuit.

FIG. 3b shows a voltage change applied to a gate of an additional upper transistor.

FIG. 3c shows clock signal outputted from a third terminal.

DETAILED DESCRIPTION OF THE INVENTION

Figure 1:
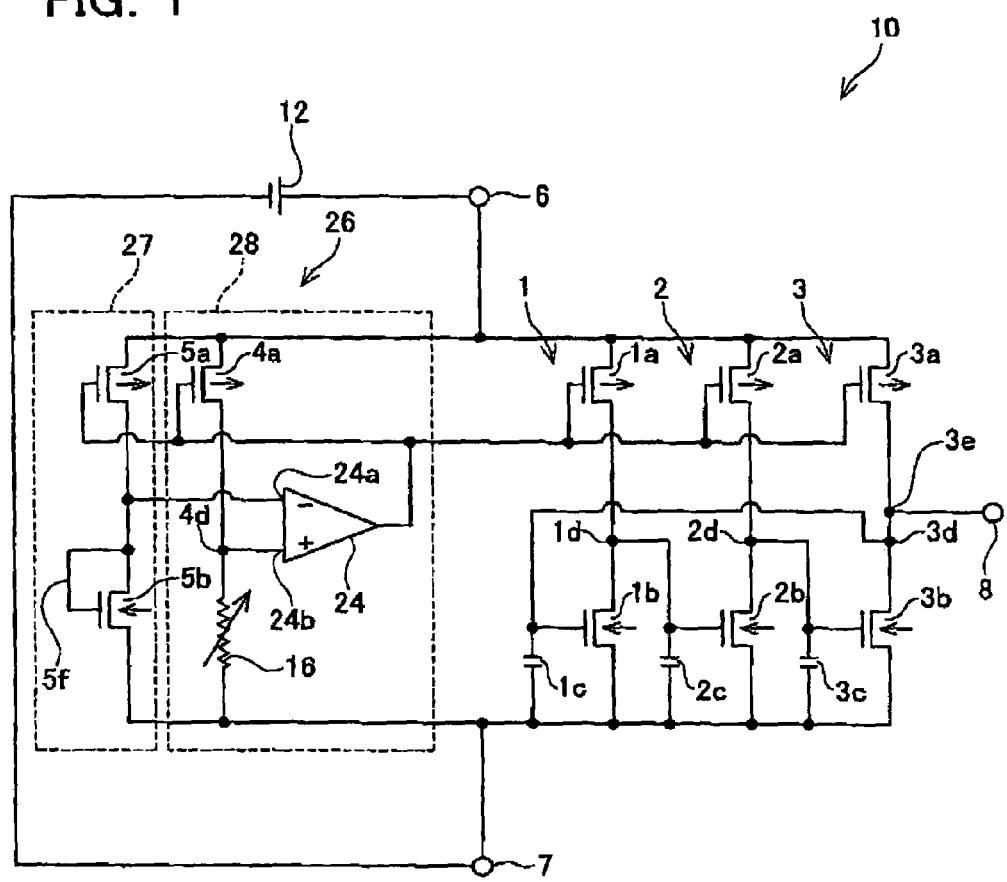
FIG. 1 shows a clock signal output circuit of Embodiment 1.

It is preferable that a current regulating circuit comprises a threshold voltage generation circuit and a bios voltage generation circuit. The threshold voltage generation circuit outputs voltage proportional to gate-source voltage of a lower transistor when the lower transistor is turned on. An output terminal of the threshold voltage generation circuit is connected to an input terminal of the bias voltage generation circuit. The bias voltage generation circuit outputs gate voltage such that a current having a magnitude that is proportional to the gate-source voltage of the lower transistor when the lower transistor is turned on flows the upper transistor. In the current regulating circuit, the threshold voltage generation circuit and the bias voltage generation circuit are preferably connected in parallel between the first and second terminals.

The threshold voltage generation circuit may preferably comprise an additional pair of transistors. In the additional pair of transistors, an upper transistor and a lower transistor are connected in series between the first and second terminals; and the drain and gate of the lower transistor are connected.

In this case, the gate-source voltage of the lower transistor when the lower transistor is tuned on can be picked up.

The threshold voltage generation circuit may preferably comprise a voltage conversion circuit that depresses voltage of a midpoint of the upper and the lower transistors of the additional pair of transistors to one-$m^{th}$ (m>1). The voltage divided to the one-$m^{th}$ is preferably inputted to the input terminal of the bias voltage generation circuit.

The effect of any change in the source-drain voltage of the upper transistor caused by the change in the source-drain voltage of the lower transistor could also be lowered, if voltage to be applied to the gate of the upper transistor was generated by utilizing the one-$m^{th}$ voltage of the threshold voltage of the lower transistor. Clock signal that can resist variations in voltage of the direct power source can be outputted It is preferable that voltage to be generated by the voltage conversion circuit is one-half of the threshold voltage of the lower transistor.

In this case, the effect of the change in the source-drain voltage of the upper transistor caused by the change in the source-drain voltage of the lower transistor could be lowered more remarkably. More stable clock signal can be outputted.

The threshold voltage generation circuit may preferably comprise an additional operational amplifier. It is preferable that the additional operational amplifier is connected between the additional pair of transistors and the voltage conversion circuit. In the case, a non-inverted input terminal of the additional operational amplifier is connected to a midpoint between the upper and lower transistors of the additional pair of transistors, a inverted input terminal of the additional operational amplifier is connected to an output terminal of the additional operational amplifier, and the output terminal of the additional operational amplifier is connected to the voltage conversion circuit.

The bias voltage generation circuit preferably comprises a series circuit and an operational amplifier. The series circuit is connected between the first and second terminals and the upper transistor and resistance are connected in series. A mid point between the upper transistor and the resistance of the series current is connected to the non-inverted input terminal of the operational amplifier, the output terminal of the threshold voltage generation circuit is connected to the inverted terminal of the operational amplifier, and the output terminal of the operational amplifier is connected to the gates of all the upper transistors.

In the above circuit, current proportional to the threshold voltage of the lower transistor flows to the resistance of the series circuit. Voltage outputted from the operational amplifier is applied to the gates of the upper transistors. Current proportional to the gate-source voltage of the lower transistor when the lower transistor is turned on can flow through the upper transistor.

In one specific embodiment of the present invention, it is preferable that the first terminal is connected to high voltage side of the direct power supply, the second terminal is connected to the low voltage side of the direct power supply, the upper transistor is a p-type transistor, and the lower transistor is an n-type transistor. In this case, the source of the p-type transistor is connected to the first terminal, the drain of the n-type transistor is connected to the drain of the p-type transistor, and the source of the n-type transistor is connected to the second terminal.

In the above specific embodiment, it is preferable that in the ring oscillator circuit an odd number of pairs of transistors are connected in parallel, each pair of transistors being comprised of the p-type transistor and the n-type transistor connected in series. It is preferable that a circuit is added, which applies voltage to the gates of the p-type transistors, where the voltage is sufficient for the current to pass through the p-type transistor, where the current is proportional to the gate-drain voltage of the n-type transistor when the n-type transistor is turned on.

In another specific embodiment of the present invention, it is preferable that the first terminal is connected to the low voltage side of the direct power supply, the second terminal is connected to the high voltage side of the direct power supply, the upper transistor is the n-type transistor, and the lower transistor is p-type transistor. In this case, the source of the n-type transistor is connected to the first terminal, the drain of n-type transistor is connected to the drain of the p-type transistor, and the source of the p-type transistor is connected to the second terminal.

In another specific embodiment described above, it is preferable that in the ring oscillator circuit an odd number of pairs of transistors are connected in parallel, each pair of transistors being comprised of the p-type transistor and the n-type transistor connected in series. It is preferable that a circuit is added, which applies voltage to the gates of the n-type transistors, where the voltage is sufficient for the current to pass through the n-type transistor, where the current is proportional to the gate-drain voltage of the p-type transistor when the p-type transistor is, turned on.

Now we compare the ring oscillator circuit of the present invention with the conventional ring oscillator circuit shown in FIG. 3a. In both the ring oscillator circuits, an odd number of pairs of transistors are connected in parallel, and each pair of transistors comprises the upper and lower transistors connected in series. The present invention can be characterized in that a circuit is added, which applies voltage to the gates of the upper transistors, where the voltage is sufficient for the current to pass through the upper transistor, where the current is proportional to the gate-drain voltage of the lower transistor when the lower transistor is turned on. Provided with the above characteristic, in theory, the oscillating frequency of the ring oscillator circuit of the present invention does not change even when supply voltage or environmental temperature varies. In fact, change in the oscillating frequency of the ring oscillator circuit of the present invention can be remarkably controlled.

Now we list specific features of the embodiments to be described below:

(Feature 1) Resistance used in the current regulating circuit is variable resistance. The oscillating frequency can be adjusted by adjusting increase or decrease in a value of the variable resistance.

(Feature 2) The source of the p-type transistor is connected to the high voltage side of the direct power supply, the drain of the n-type transistor is connected to the drain of the p-type transistor, and the source of the n-type transistor is connected to the low voltage side of the direct power source. In addition, the current regulating circuit is connected to the gate of the p-type transistor.

(Feature 3) The source of the p-type transistor is connected to the high voltage side of the direct power supply, the drain of the n-type transistor is connected to the drain of the p-type transistor, and the source of the n-type transistor is connected to the low voltage side of the direct power source. In addition, the current regulating circuit is connected to the gate of the n-type transistor.

(Feature 4) An emitter of a pnp transistor is connected to the high voltage side of the direct power supply, a collector of an npn transistor is connected to the collector of the pnp transistor, and the emitter of the npn transistor is connected to the low voltage side of the direct power source.

(Feature 5) In the threshold voltage generation circuit, the upper transistor and a diode are connected in series between the first and second terminals.

(Feature 6) A voltage follower circuit is connected between a midpoint of the upper and lower transistors of the additional pair of transistors and the input terminal of the voltage conversion circuit, In the following, we describe the embodiments in detail, with reference to the drawings.

EMBODIMENT 1

A ring oscillator circuit 10 shown in FIG. 1 comprises a first terminal 6 to be connected to a positive pole of the direct power source 12, a second terminal 7 to be connected to a negative pole of the direct power source 12, and a third terminal 8 for outputting clock signal.

Between the first terminal 6 and the second terminal 7 are connected a $1^{st}$ pair of transistors 1 in which an upper transistor 1a and a lower transistor 1b are connected in series, a $2^{nd}$ pair of transistors 2 in which an upper transistor 2a and a lower transistor 2b are connected in series, and a $3^{rd}$ pair of transistors 3 in which an upper transistor 3a and a lower transistor 3b are connected in series.

An odd number (3 in FIG. 1) of the $1^{st}$ pair of transistors 1, the $2^{nd}$ pair of transistors 2, and the $3^{rd}$ pair of transistors 3 are connected in parallel between the first terminal 6 and the second terminal 7. A midpoint 1d of the upper transistor 1a and the lower transistor 1b is connected to a gate of the lower transistor 2b. A midpoint 2d of the upper transistor 2a and the lower transistor 2b is connected to the gate of the lower transistor 3b. A midpoint 3d of the upper transistor 3a and the lower transistor 3b is connected to the gate of the lower transistor 1b.

A capacitor 1c is inserted between the gate of the lower transistor 1b and the second terminal 7. A capacitor 2c is inserted between the gate of the lower transistor 2b and the second terminal 7. A capacitor 3c is inserted between the gate of the lower transistor 3b and the second terminal 7.

A third terminal 8 is connected to a midpoint 3e between the upper transistor 3a and the lower transistor 3b. The third terminal 8 may be connected to either the midpoint 1d or 2d.

The respective upper transistors 1a, 2a, 3a are a p-type MOSFET and have same specification. The respective lower transistors 1b, 2b, 3b are a n-type MOSFET and have same specification. The respective capacitors 1c, 2c, 3c have same specification.

The ring oscillator circuit 10 of the present embodiment comprises a current regulator (current regulating circuit) 26 connected to the gates of the upper transistors 1a, 2a, 3a.

The current regulator 26 comprises a threshold voltage generation circuit 27 and a bias voltage generation circuit 28. The threshold voltage generation circuit 27 comprises an additional pair of transistors in which the upper transistor 5a and the lower transistor 5b are connected in series between the fist terminal 6 and the second terminal 7. The drain and gate of the lower transistor 5b are connected by the connection 5f. The bias voltage generation circuit 28 has a series circuit of the upper transistor 4a and the variable resistance 16 connected between the first terminal 6 and the second terminal 7, and further comprises an operational amplifier 24. An invert input terminal 24a of the operational amplifier 24 is connected to a midpoint of the upper transistor 5a and the lower transistor 5b of the additional pair of transistors. A non-inverted input terminal 24b of the operational amplifier 24 is connected to a midpoint of the upper transistor 4a and the variable resistance 16 of the series circuit. An output terminal of the operational amplifier 24 is connected to the gates of all the upper transistors 1a, 2a, 3a, 4a, 5a.

In addition, adjustment of a resistance value of the variable resistance 16 enables adjustment of the oscillating frequency that is at constant level against any variation in the environmental temperature or supply voltage of the direct power source 12, by arbitrarily increasing or decreasing the resistance value.

The upper transistor 4a used in the additional pair of transistors and the upper transistor 5a used in the series circuit are the p-type MOSFET. The lower transistor 5b used in the additional pair of transistors is the n-type MOSFET. The upper transistors 1a, 2a, 3a, 4a, 5a have same specification. The lower transistors 1b, 2b, 3b, 4b, 5b have same specification.

The threshold voltage $V_T$ of the lower transistor 5b is inputted to the inverted input terminal 24a of the operational amplifier 24. When the threshold voltage $V_T$ of the lower transistor 5b changes due to variation in the environmental temperature, voltage equal to the changed threshold voltage $V_T$ is inputted to the inverted input terminal 24a of the operational amplifier 24.

The inverted input terminal 24a and the non-inverted input terminal 24b are adjusted through a virtual short so that a potential difference will be zero. Thus, voltage at the midpoint 4d of the upper transistor 4a and the resistance 16 will be adjusted to the voltage of the inverted input terminal 24a of the operational amplifier 24, i.e., the same potential as the threshold voltage $V_T$ of the lower transistor 5b. As a result, current proportional to the threshold voltage $V_T$ of the lower transistor 5b flows through the resistance 16. To this end, the voltage of the gate of the upper transistor 4a is maintained at the voltage for the current proportional to the threshold voltage $V_T$ of the lower transistor 5b flows between the source and drain of the upper transistor 4a. In addition, as the source of the upper transistor 4a and the source of the upper transistor 1a are connected, and the gate of the upper transistor 4a and the gate of the upper transistor 1a are connected, the current flowing through the upper transistor 1a is proportional to that flowing through the upper transistor 4a. Then, a current ratio of the current flowing through the upper transistor 1a to that through the upper transistor 4a will be the ratio of transistor size of the upper transistor 1a to the upper transistor 4a. Similarly, as the source of the upper transistor 4a and the source of the upper transistor 2a are connected and the gate of the upper transistor 4a and the gate of the upper transistor 2a are connected, the current proportional to the current flowing through the upper transistor 4a flows through the upper transistor 2a. In addition, as the source of the upper transistor 4a and the source of the upper transistor 3a are connected, and the gate of the upper transistor 4a and the gate of the upper transistor 3a are connected, the current proportional to the current flowing through 4a flows through the upper transistor 3a. This establishes a proportional relationship between the current IP flowing through the pairs of transistors 1, 2, 3 and the threshold voltage $V_T$.

With the above current regulator 26, when voltage is applied to the gates of the respective upper transistors 1a, 2a, 3a, current proportional to the gate-source voltage of the lower transistors 1b, 2b, 3b of when the respective transistors 1b, 2b, 3b are turned on can be passed through the source-drain of the respective upper transistors 1a, 2a, 3a.

The ring oscillator circuit 10 operates as described below. In the voltage of the capacitors 1c, 2c, 3c and temporal change shown in FIG. 4, only the transistor 2b is on immediately before timing $t_0$, for instance, and the transistors 1b and 3b are off. As the transistor 2b is on, the capacitor 3c is discharged. As the transistor 3b is off, the capacitor 1c is being charged. As the transistor 1b is off, the capacitor 2c is being charged.

At timing $t_0$, when voltage of the capacitor 1c becomes equal to the threshold voltage $V_T$ of the transistor 1b, the transistor 1b is turned on. As a result, the capacitor 2c begins to discharge and the transistor 2b is turned off after time period of $t_f$ has passed from the timing $t_0$. When the transistor 2b is turned off, the capacitor 3c begins to charge.

At timing $t_1$, when voltage of the capacitor 3c becomes equal to the threshold voltage $V_T$ of the transistor 3b, the transistor 3b is turned on. As a result, the capacitor 1c begins to discharge and the transistor 1b is turned off after time period of $t_f$ has passed from the timing $t_1$. When the transistor 1b is turned off, the capacitor 2c begins to charge.

At timing $t_2$, when voltage of the capacitor 2c becomes equal to the threshold voltage $V_T$ of the transistor 2b, the transistor 2b is turned on. As a result, the capacitor 3c begins to discharge and the transistor 3b is turned off after time period of $t_f$ has passed from the timing $t_2$. When the transistor 3b is turned off, the capacitor 1c begins to charge.

At timing $t_3$, when voltage of the capacitor 1c becomes equal to the threshold voltage $V_T$ of the transistor 1b, the transistor 1b is turned on. As a result, the capacitor 2c begins to discharge and the transistor 2b is turned off after time period of $t_f$ has passed from the timing $t_3$. When the transistor 2b is turned off, the capacitor 3c begins to charge. This event is equal to that at the timing $t_0$. Some phenomenon occurs at the timings $t_1$ and $t_4$, and at timing $t_2$ $_{and\ t5}$.

With the ring oscillator circuit 10, the transistor 1b repeats the action of turning on at timing $t_0$ and turning off at $t_1+t_f$. The transistor 2b repeats the action of turning on at timing $t_2$ and turning off at $t_3+t_f$. The transistor 3b repeats the action of turning on at timing $t_1$ and turning off at $t_2+t_f$.

The following formula (5) is established between current IP flowing through the respective pair of transistors 1, 2, 3 and the threshold voltage $V_T$:

[Formula 5]

$$IP = d \times V_T \quad (5)$$

Where d is a proportional constant.

If this is introduced into the formula (4), the following formula (6) can be obtained.

[Formula 6]

$$f \approx \frac{d \times V_T}{3 \times CD \times V_T} = \frac{d}{3 \times CD} \quad (6)$$

The oscillating frequency f of the ring oscillator circuit 10 can be expressed by the formula (6).

The effect on the oscillating frequency f of the current IP flowing through the respective pair of transistors 1, 2, 3 counteracts the effect on the oscillating frequency f of the threshold voltage $V_T$ of the lower transistor, and thus the oscillating frequency can be maintained at constant level.

With the clock signal output circuit of the present embodiment, change in the oscillating frequency f can be remarkably controlled regardless of possible variation in the supply voltage of the direct power source 12 or environmental temperature.

Figure 2:
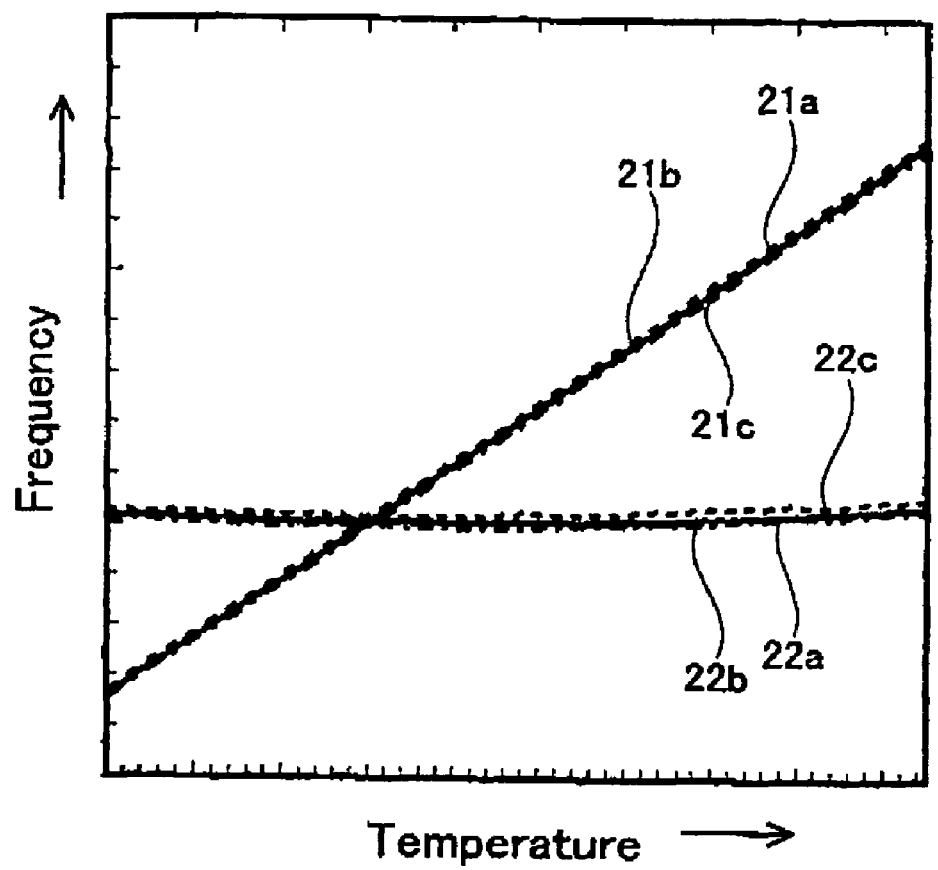
FIG. 2 shows a relationship between the oscillating frequency and the environmental temperature.

The vertical axis of FIG. 2 represents the oscillating frequency f of the ring oscillator circuit 10, while the horizontal axis represents the environmental temperature. Curves 21a, 21b, 21c show relationships between the oscillating frequency of the ring oscillator circuit 30 of FIG. 3 and the environmental temperature. The curve 21a shows the case in which voltage of the direct power source 12 is 3.6 volts, the curve 21b shows the case in which voltage of the direct power source 12 is 3.3 volts, and the curve 21c shows the case in which voltage of the direct power source 12 is 3.0 volts. The ring oscillator circuit 30 of FIG. 3 can maintain certain oscillating frequency, even when voltage of the direct power source 12 fluctuates. However, as can be seen from the fact that the curves 21a, 21b, 21c are inclined, in the ring oscillator circuit 30, the oscillating frequency varies when the environmental temperature fluctuates.

Curves 22a, 22b, 22c shows a relationship between the oscillating frequency of the ring oscillator circuit 10 of the present embodiment shown in FIG. 1 and the environmental temperature. The curve 22a shows the case in which voltage of the direct power source 12 is 3.6 volts, the curve 22b shows the case in which voltage of the direct power source is 3.3 volts, and the curve 22c shows the case in which voltage of the direct power source 12 is 3.0 volts. In the ring oscillator circuit 10 of this embodiment shown in FIG. 1, the oscillating frequency f can be maintained almost at constant level even when voltage of the direct power source 12 or the environmental temperature varies. At least variation in the oscillating variation can be remarkably controlled.

EMBODIMENT 2

Figure 5:
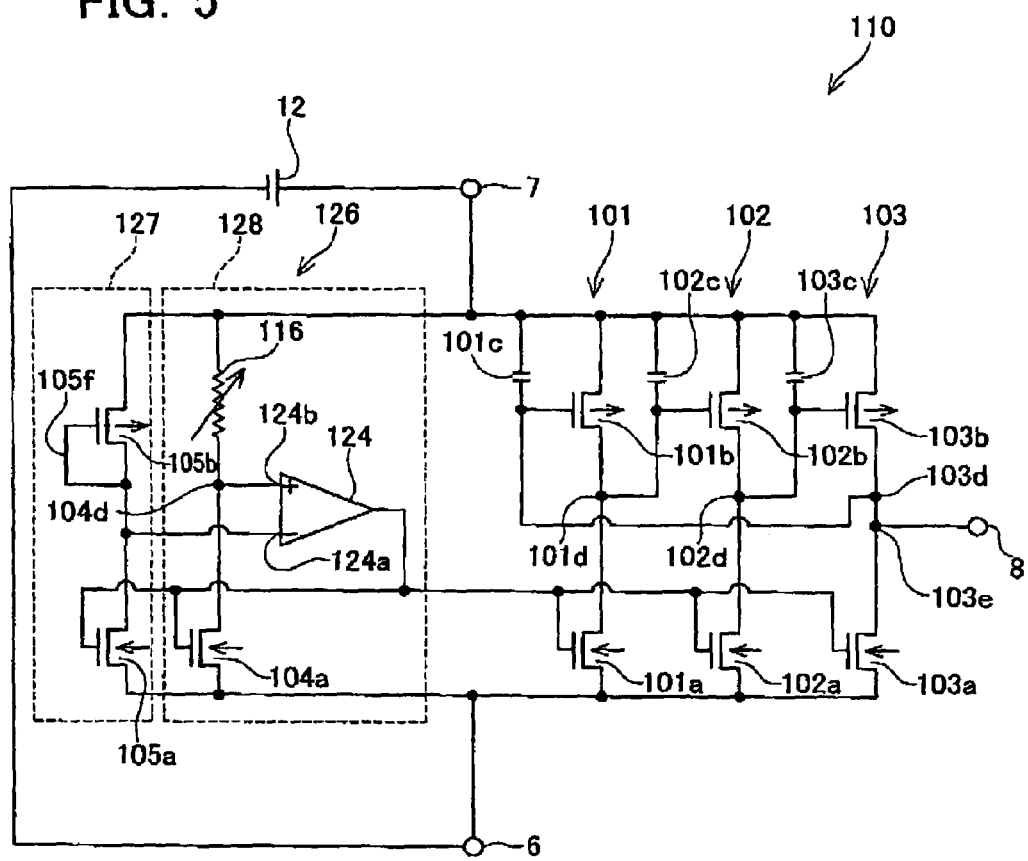
FIG. 5 shows a clock signal output circuit of Embodiment 2.

A ring oscillator circuit 110 as shown in FIG. 5 is a variant example of the embodiment 1 and is a clock signal output circuit for generating clock signal with reference to positive voltage. In configuration substantially identical to the ring oscillator circuit 10, same components are assigned with either same reference numbers or reference numbers having same numbers in last two digits. Thus, overlapping description thereof is omitted.

The ring oscillator 110 as shown in FIG. 5 comprises a first terminal 6 to be connected to a negative pole of the direct power source 12, a second terminal 7 to be connected to a positive pole of the direct power source 12, and a third terminal 8 for outputting clock signal.

Between the first terminal 6 and the second terminal 7 are connected a first pair of transistors 101 in which an upper transistor 101a and a lower transistor 101b are connected in series, a second pair of transistors 102 in which an upper transistor 102a and a lower transistor 102b are connected in series, and a third pair of transistors 103 in which an upper transistor 103a and a lower transistor 103b are connected in series.

Between the first terminal 6 and the second terminal 7 the $1^{st}$ pair of transistors 101, the $2^{nd}$ pair of transistors 102, and the $3^{rd}$ pair of transistors 103 are connected in parallel. A midpoint 101d between the upper transistor 101a and the lower transistor 101b is connected to a gate of the lower transistor 102b. A midpoint 102d between the upper transistor 102a and the lower transistor 102b is connected to a gate of the lower transistor 103b. A midpoint 103d between the upper transistor 103a and the lower transistor 103b is connected to a gate of the lower transistor 101b.

A capacitor 101c is inserted between the gate of the lower transistor 101b and the second terminal 7. A capacitor 102c is inserted between the gate of the lower transistor 102b and the second terminal 7. A capacitor 103c is inserted between the gate of the lower transistor 103b and the second terminal 7.

A third terminal 8 is connected to a midpoint 103e between the upper transistor 103a and the lower transistor 103b. The third terminal 8 may be connected to any of the midpoints 101d or 102d.

The respective upper transistors 101a, 102a, 103a are n-type MOSFET and have same specification. The respective lower transistors 101b, 102b, 103b are p-type MOSFET and have same specification. The respective capacitors 101c, 102, 103c have same specification.

The ring oscillator circuit 110 of the present embodiment comprises a current regulator 126 connected to the gate of the upper transistors 101a, 102a, 103a.

The current regulator 126 comprises a threshold generation circuit 127 and a bias voltage generation circuit 128. The threshold voltage generation circuit 127 comprises an additional pair of transistors in which the upper transistor 105a and the lower transistor 105b are connected in series between the first terminal 6 and the second terminal 7. The drain and gate of the lower transistor 105b are connected by the connection 105f. The bias voltage generation circuit 128 has a series circuit of the upper transistor 104a and the variable resistance 116 connected between the first terminal 6 and the second terminal 7, and further comprises an operational amplifier 124. An inverted input terminal 124a of the operational amplifier 124 is connected to a midpoint of the upper transistor 105a and the lower transistor 105b of the additional pair of transistors. A non-inverted input terminal 124b of the operational amplifier 124 is connected to a midpoint of the upper transistor 104a and the variable resistance 116 of the series circuit. An output terminal of the operational amplifier 24 is connected to the gates of all the upper transistors 101a, 102a, 103a, 104a, 105a.

The upper transistors 101a, 102a, 103a, 104a, 105a are the n-type MOSFET. The lower transistors 101b, 102b, 103b, 105b are the p-type MOSFET. Source of the upper transistors are connected to the power source 12. Source of the lower transistors are connected to the power source 12. Drains of the upper transistors are connected to drains of lower transistors.

The clock signal output circuit of this embodiment is a ring oscillator circuit in which an odd number of pairs of transistors are connected in parallel, each pair of transistors being comprised of a p-type MOSFET and the n-type MOSFET connected in series. The ring oscillator circuit 110 is added a circuit 126, which applies voltage to the gates of the n-type MOSFET 101a-103a, where the voltage is sufficient for the current to pass through the n-type MOSFET 101a-103a, where the current is proportional to the gate-drain voltage of the p-type MOSFET 101b-103b when the p-type MOSFET 101b-103b is turned on. Also in this case, due to the effect similar to the embodiment 1 described above, variation in the oscillating frequency f can be remarkably controlled regardless of possible variation in voltage of the direct power source 12 or the environmental temperature.

EMBODIMENT 3

Figure 6:
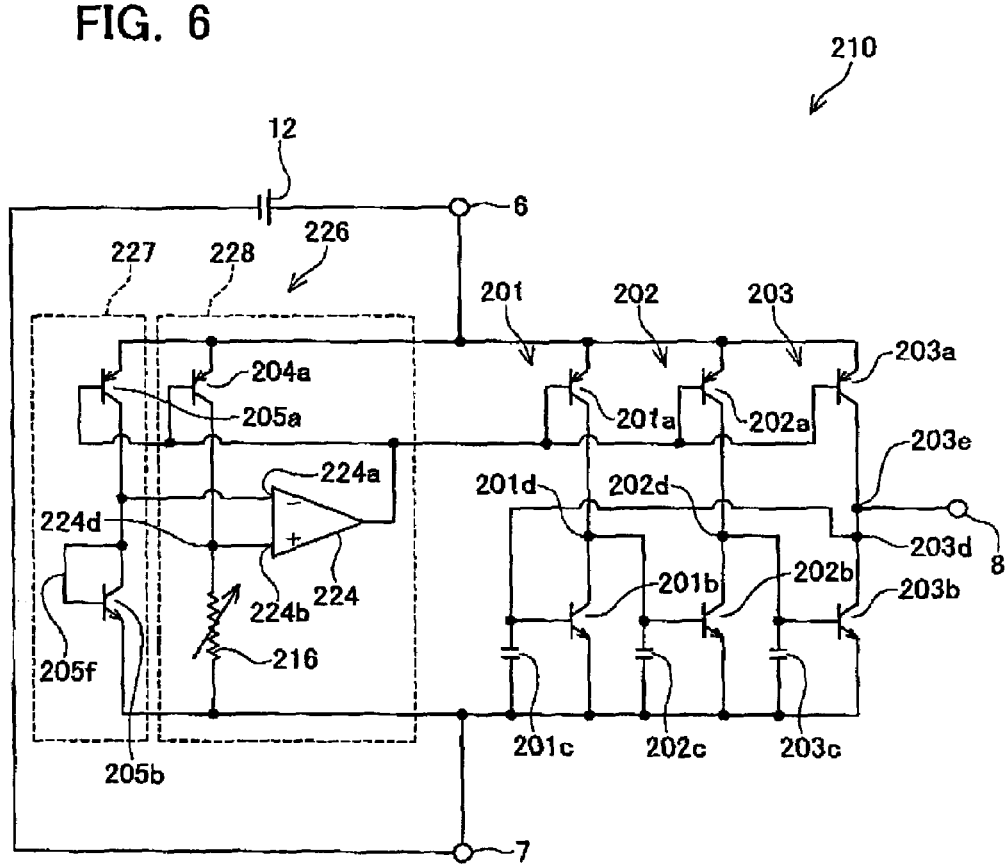
FIG. 6 shows a clock signal output circuit of Embodiment 3.

A ring oscillator circuit 210 as shown in FIG. 6 is a variant example of the embodiment 1 and is a clock signal output circuit for generating clock signal with reference to negative voltage. In configuration substantially identical to the ring oscillator circuit 10, same components are assigned with either same reference numbers or reference numbers having same numbers in last two digits. Thus, overlapping description thereof is omitted.

The clock signal output circuit 210 of this embodiment is a ring oscillator circuit in which an odd number of pair of transistors are connected in parallel, each pair of transistors being comprised of pnp transistors and npn transistors connected in series. The ring oscillator circuit 210 is added a circuit 226, which applies voltage to the bases of the pnp transistors 201a, 2021, 203a, where the voltage is sufficient for the current to pass through the pnp transistors 201a, 202a, 203a, where the current is proportional to the base-emitter voltage of the npn transistors 201b, 202b, 203b when the npn transistors 201b, 202b, 203b is turned on. Also in this case, due to the effect similar to the embodiment 1 described above, variation in the oscillating frequency can be remarkably controlled regardless of possible variation in voltage of the direct power source 12 or the environmental temperature.

EMBODIMENT 4

Figure 7:
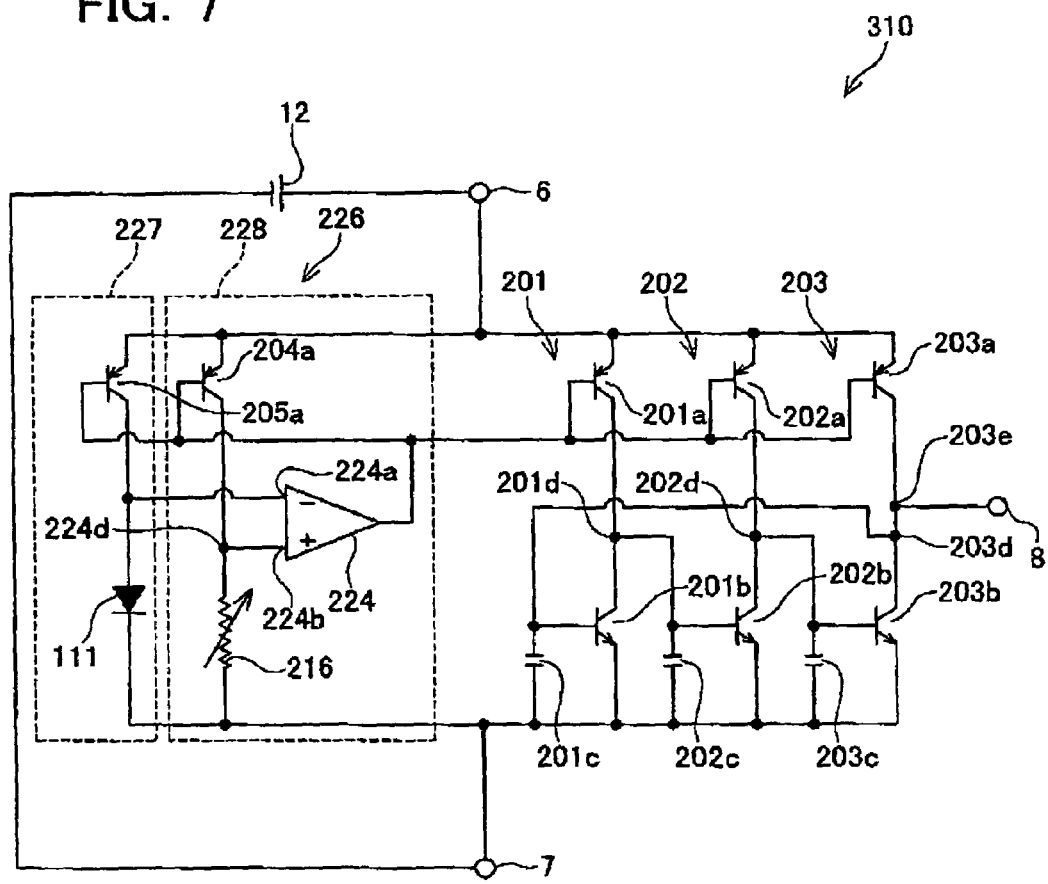
FIG. 7 shows a clock signal output circuit of Embodiment 4.

A ring oscillator circuit 310 as shown in FIG. 7 is a variant example of the embodiment 1 or 3, and is a clock signal output circuit for generating clock signal with reference to negative voltage. In configuration substantially identical to the ring oscillator circuit 10, 210, same components are assigned with either same reference numbers or reference numbers having same numbers in last two digits. Thus, overlapping description thereof is omitted.

The clock signal output circuit 310 of this embodiment is a ring oscillator circuit in which an odd number of pair of transistors 201, 202, 203 are connected in parallel, each pair of transistors being comprised of pnp transistors and npn transistors connected in series. The ring oscillator 310 circuit is added a circuit 226, which applies voltage to the bases of the pnp transistors 201a, 202a, 203a, where the voltage is sufficient for the current to pass through the pnp transistors 201a, 202a, 203a, where the current is proportional to the base-emitter voltage of the npn transistors 201b, 202b, 203b when the npn transistors 201b, 202b, 203b is turned on. In this embodiment, a threshold voltage generation circuit 227 has a pnp transistor 205a and a diode 111 connected in series. Also in this case, when the threshold voltage of the diode 111 equals to that of the respective npn transistors 201b, 202b, 203b, due to the effect similar to the embodiment 1 or 3 described above, variation in the oscillating frequency can be remarkably controlled regardless of possible variation in voltage of the direct power source 12 or the environmental temperature.

EMBODIMENT 5

Figure 8:
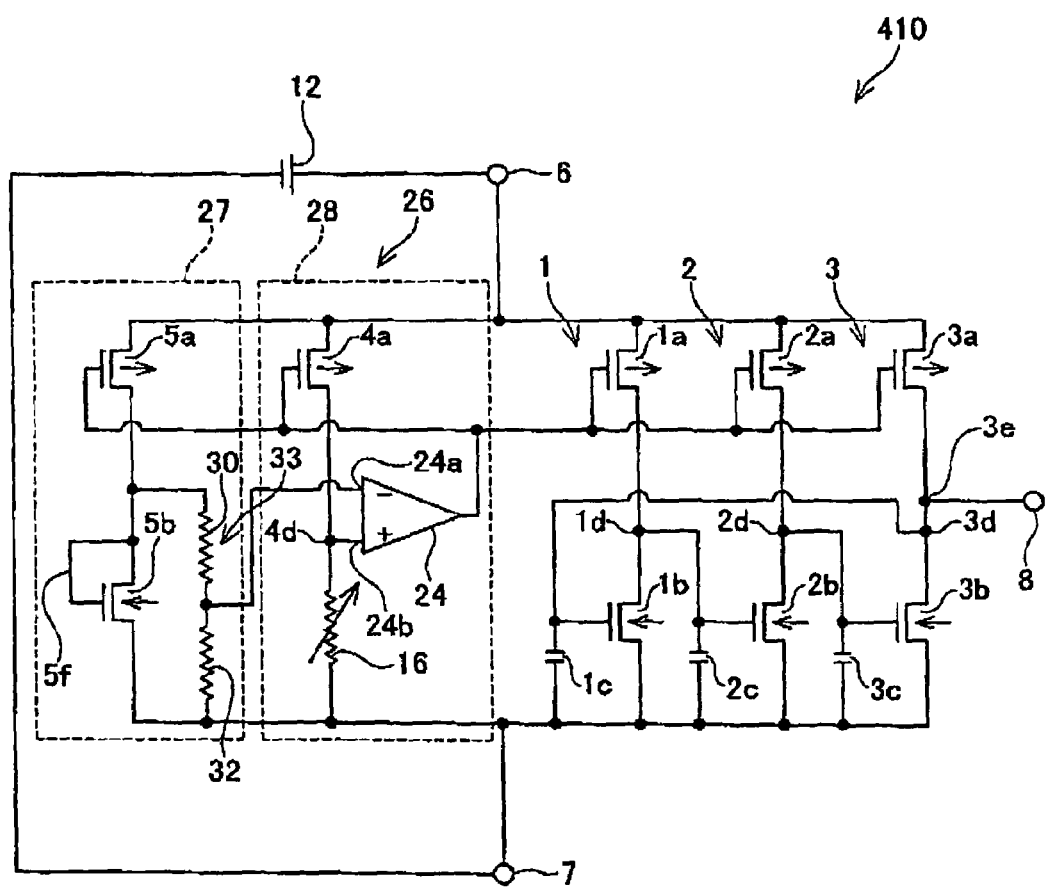
FIG. 8 shows a clock signal output circuit of Embodiment 5.

A ring oscillator circuit 410 as shown in FIG. 8 is a variant example of the embodiment 1, and is a clock signal output circuit for generating clock signal with reference to negative supply voltage. In configuration substantially identical to the ring oscillator circuit 10, same components are assigned with either same reference numbers or reference numbers having same numbers in last two digits. Thus, overlapping description thereof is omitted.

A ring oscillator circuit 410 is characterized in that the threshold voltage generation circuit 27 comprises a voltage conversion circuit 33 (to be specific, a voltage dividing circuit). The voltage conversion circuit 33 is connected between a midpoint of the upper transistor 5a and the lower transistor 5b of the threshold voltage generation circuit 27 and the second terminal 7. The voltage conversion circuit 33 comprises a first resistance 30 and a second resistance 32 connected in series. A resistance value of the first resistance 30 equals to that of the second resistance 32. A midpoint between the first resistance 30 and the second resistance 32 is connected to an inverted input terminal 24a of an operational amplifier 24.

The voltage conversion circuit 33 divides threshold voltage $V_T$ of the lower transistor 5b and outputs the divided voltage to the inverted input terminal 24a of the operational amplifier 24. Since the resistance value of the first resistance 30 is equal to that of the second resistance 32, the threshold voltage $V_T$ of the lower transistor 5b is divided to one-half. The one-half of the threshold voltage $V_T$ of the lower transistor 5b is inputted into the inverted input terminal 24a of the operational amplifier 24.

Now we briefly describe a problem to be solved by the ring oscillator circuit 410. The description of the problem refers to comparison with the ring oscillator circuit 10 of the embodiment 1 described above. In the ring oscillator circuit 10 of the embodiment 1, the current regulator 26 generates gate voltage for passing through the upper transistors 1a, 2a, 3a current proportional to the threshold voltage $V_T$ of the lower transistors 1b, 2b, 3b. The gate voltage is applied to the gates of the upper transistors 1a, 2a, 3a. The current regulator 26 generates voltage to be applied to the upper transistors 1a, 2a, 3a by employing the bias voltage generation circuit 28. Functionally looking at how the bias voltage generation circuit 28 generates gate voltage, the bias voltage generation circuit 28 adjusts a potential of the midpoint 4d between the upper transistor 4a and the resistance 16 to the same potential as that of the threshold voltage $V_T$ of the lower transistor 5b, by utilizing the operational amplifier 24. Further, it generates current corresponding to the potential of the midpoint 4d by utilizing the resistance 16. In addition, it converts the current generated by the resistance 16 into gate voltage corresponding to that current by utilizing the upper transistor 4a. In the bias voltage generation circuit 28, potential of the midpoint 4d is adjusted to the threshold voltage $V_T$ of the lower transistor 5b. In fact, the source-drain voltage of the upper transistor 4a is always maintained at a difference between a potential of the positive pole of the direct power source 12 and that of threshold voltage $V_T$ of the lower transistor 5b.

The gate voltage generated by the bias voltage generation circuit 28 is applied to the gates of the upper transistors 1a, 2a, 3a of the parallel circuit. If the source-drain voltage of the upper transistors 1a, 2a, 3a is a difference between the potential of the positive pole of the direct power source 12 and that of threshold voltage $V_T$, the gate voltage of the upper transistor 4a of the bias voltage generation circuit 28 will match gate voltage of the upper transistors 1a, 2a, 3a of the parallel circuit. In fact, current flowing through the upper transistor 4a matches current flowing through the upper transistors 1a, 2a, 3a. Strictly speaking, however, the current flowing through the upper transistor 4a does not match the current flowing through the upper transistors 1a, 2a, 3a. If the lower transistors 1b, 2b, 3b repeat on/off, the source-drain voltage of the lower transistors 1b, 2b, 3b repeat increasing and decreasing, and accordingly, the source-drain voltage of the upper transistors 1a, 2a, 3a also repeat increasing and decreasing. Consequently, the current flowing through the upper transistors 1a, 2a, 3a repeat increasing and decreasing. The ring oscillator circuit 10 of the embodiment 1 attempted to adjust the current flowing through the upper transistors 1a, 2a, 3a based on the generated gate voltage. However, in practice, because the source-drain voltage of the upper transistors 1a, 2a, 3a vary, current that is different from the intended current passes through the upper transistors 1a, 2a, 3a.

Figure 4:
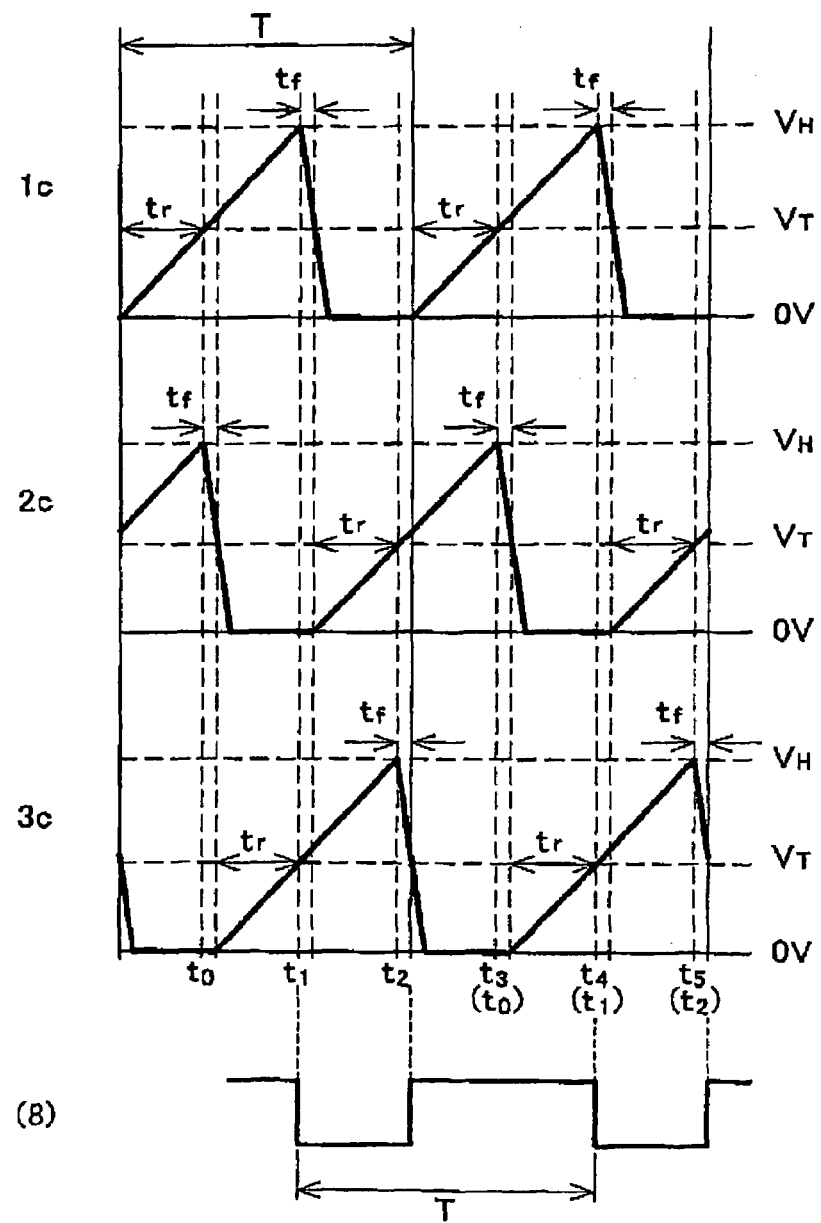
FIG. 4 shows temporal change of voltage applied to capacitors 1c-3c.

If average current is kept at constant level against variation in supply voltage of the environmental temperature or the direct power source 12, even when the current flowing through upper transistors 1a, 2a, 3a repeat increasing and decreasing, it will not affect the oscillating frequency. In practice, however, the average current through the upper transistors 1a, 2a, 3a differs depending on value of voltage of the direct power source 12. Consequently, if voltage of the direct power source differs, the average current through the upper transistors 1a, 2a, 3a will vary. Therefore, a different voltage of the direct power source 12 would lead to a different average current through the upper transistors 1a, 2a, 3a. Therefore, if voltage of the direct power source 12 differs, average current of the current flowing through the upper transistors 1a, 2a, 3a will be different. If the average current of the current flowing through the upper transistors 1a, 2a, 3a differs, speed of accumulating charges on the capacitors 1c, 2c, 3c of the parallel circuit will differ, and thus the oscillating frequency will also fluctuate. Specifically, as shown in FIG. 4, the gate voltage of the lower transistors 1b, 2b, 3b repeats increasing and decreasing in a range of 0 to $V_H$ volts. Among these, it is the current flowing though the upper transistors 1a, 2a, 3a while the gate voltage of the lower transistors 1b, 2b, 3b fluctuates from 0 to the threshold voltage $V_T$ volts that affects the oscillating frequency. If the average current following through the upper transistors 1a, 2a, 3a in this period differs, the speed of accumulating charges on the capacitors 1c, 2c, 3c of the parallel circuit will differ and thus the oscillating frequency will also vary. We describe this phenomenon in detail by referring to FIG. 10.

Figure 10:
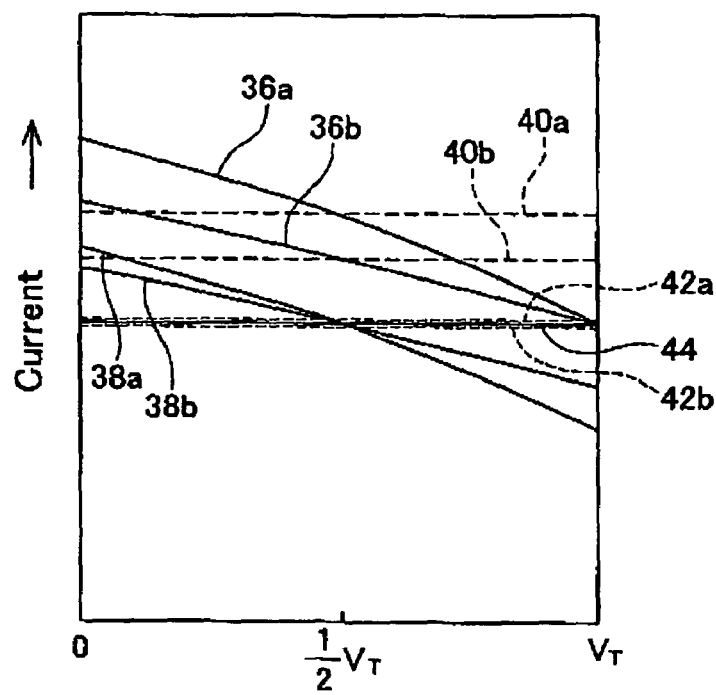
FIG. 10 shows a relationship between drain voltage and current when supply voltage is changed, in the clock signal output circuits in Embodiments 1 and 5.

The graph of FIG. 10 shows change in the current flowing through the upper transistors 1a, 2a, 3a when voltage of the direct power source 12 is changed in the case of using the ring oscillator circuits 10 and 410. The temperature of the environment in which the ring oscillators 10, 410 are operated is 25° C. The vertical axis of the graph represents a value of the current flowing through the upper transistors 1a, 2a, 3a, while the horizontal axis represents drain voltage of the upper transistors 1a, 2a, 3a (which is equal to voltage applied to the gates of the lower transistors 1b, 2b, 3b of a subsequent pair of transistors). A curve 36a shows the current flowing through the upper transistors 1a, 2a, 3a of the ring oscillator circuit 10 when the direct power source 12 is 4 volts. A curve 36b shows the current flowing through the upper transistors 1a, 2a, 3a of the ring oscillator circuit 10 when the direct power source 12 is 5 volts. A curve 38a shows the current flowing through the upper transistors 1a, 2a, 3a when the direct power source 12 of the ring oscillator circuit 410 is 4 volts. A curve 38b shows the current flowing through the upper transistors 1a, 2a, 3a when the direct power source 12 of the ring oscillator circuit 410 is 5 volts. The straight line 44 in the figure represents the current flowing through the upper transistor 4a. A straight line 40a shows an average of the current flowing through the upper transistors 1a, 2a, 3a when the drain voltage of the upper transistors 1a, 2a, 3a changes from 0 volt to $V_T$ volts, and when the direct power source 12 of the ring oscillator 10 is 4V. A straight line 40b shows an average of the current flowing through the upper transistors 1a, 2a, 3a when the drain voltage of the upper transistors 1a, 2a, 3a changes from 0 volt to $V_T$ volts, and when the direct power source 12 of the ring oscillator 10 is 5V. A straight line 42a shows an average of the current flowing through the upper transistors 1a, 2a, 3a when the drain voltage of the upper transistors 1a, 2a 3a changes from 0 volt to $V_T$ volts, and when the direct power source 12 of the ring oscillator circuit 410 is 4 volts. A straight line 42b shows an average of the current flowing through the upper transistors 1a, 2a, 3a when the drain voltage of the upper transistors 1a, 2a, 3a changes from 0 volt to $V_T$ volts, and when the direct power source 12 of the ring oscillator circuit 410 is 5V.

As shown in the curves 36a, 36b, in the ring oscillator circuit 10 of the embodiment 1, if the drain voltage of the upper transistors 1a, 2a, 3a is $V_T$ volts, the current flowing through the upper transistors 1a, 2a, 3a is equal even when the supply voltage of the direct power source 12 differs. However, if the drain voltage of the upper transistors 1a, 2a, 3a changes from 0 volt to $V_T$ volts, the current flowing through the upper transistor 1a, 2a, 3a varies and a difference with average currents 40a, 40b will widely differ.

On the one hand, in the ring oscillator circuit 410 of the embodiment 5, the drain voltage of the upper transistors 1a, 2a, 3a is $V_T/2$ volts, the current flowing through the upper transistors 1a, 2a, 3a is equal even though the supply voltage of the direct power source 12 differs. Also in this case, if the drain voltage of the upper transistors 1a, 2a, 3a changes from 0 volt to $V_T$ volts, the current flowing through the upper transistors 1a, 2a, 3a varies. However, if the setting is such that the current flowing through the upper transistors 1a, 2a, 3a will be equal even if the supply voltage of the direct power source 12 differs when the drain voltage is $V_T/2$ volts, the average currents 42a, 42b will almost match even though the supply voltage of the direct power source 12 varies. Therefore, in the ring oscillator circuit 410, it is possible to stabilize the oscillating frequency even when the supply voltage of the direct power source 12 varies.

In the following, we verify the above phenomenon using formulas. An average of the current IPb flowing through the upper transistors 1a, 2a, 3a can be expressed by the formula (7).

[Formula 7] (7)
$$IPb = \frac{1}{2} \times \mu \times C_0 \times \frac{W}{L} \times (V_a - V_{Ta})^2 \times \left\{1 + \lambda \times \left(Vd - \frac{V_T}{2}\right)\right\}$$

In the above, μ represents mobility of electrons of carriers in the upper transistors 1a, 2a, 3a. $C_0$ represents capacity of a pseudo-capacitor formed in a gate electrode, a gate insulating film, and a semiconductor area of the upper transistors 1a, 2a, 3a. W represents width of the gate electrode of the upper transistors 1a, 2a, and 3a. L represents length of the gate electrode of the upper transistors 1a, 2a, 3a. $V_a$ represents gate-source voltage of the upper transistors 1a, 2a, 3a. $V_{Ta}$ represents threshold voltage of the gates of the upper transistors 1a, 2a, 3a. λ represents a factor of changing current flowing through the upper transistors 1a, 2a, 3a when length of channels formed in the upper transistors 1a, 2a, 3a varies (referred to as channel length modulation effect). Vd represents voltage of the direct power source 12. $V_T/2$ represents voltage accumulated in the capacitors 1c, 2c, 3c connected between the gates of the lower transistors 1b, 2b, 3b and the second terminal 7 (i.e., the drain voltage of the upper transistors 1a, 2a, 3a).

As described above, the drain voltage of the upper transistors 1a, 2a, 3a changes from 0 volt to $V_T$ volts. In fact, an average of the drain voltage of the upper transistors 1a, 2a, 3a is $V_T/2$.

On the one hand, a value of the current $I_{ref}$ flowing the transistor 4a of the ring oscillator 10 can be expressed by the formula (8) or (9).

[Formula 8] (8)
$$I_{ref} = \frac{1}{2} \times \mu \times C_0 \times \frac{W}{L} \times (V_a - V_{Ta})^2 \times \{1 + \lambda \times (Vd - V_T)\}$$

-continued

[Formula 9] (9)
$$I_{ref} = \frac{V_T}{R_{ref}}$$

In the above, $R_{ref}$ represents a resistance value of the resistance 16.

With the above formula (4), the oscillating frequency f of the ring oscillator 10 can be expressed by the formula (10).

[Formula 10] (10)
$$f \approx \frac{IPb}{3 \times CD \times V_T}$$

If the formulas (7), (8), (9) are substituted into the formula (10), the following formula (11) can be obtained.

[Formula 11] (11)
$$f \approx \frac{1}{3 \times CD \times R_{ref}} \times \frac{1 + \lambda \times \left(Vd - \frac{V_T}{2}\right)}{1 + \lambda \times (Vd - V_T)}$$

As shown in the formula (11), the oscillating frequency of the ring oscillator 10 is affected by charging λ or $V_T$.

In the ring oscillator circuit 410, voltage to be inputted into the inverted input terminal 24a of the operational amplifier 24 is converted into $V_T/2$ by voltage conversion circuit 33. In other words, the current value $I_{ref}$ flowing through the transistor 4a of the ring oscillator circuit 410 can be expressed by the formula (12).

[Formula 12] (12)
$$I_{ref} = \frac{1}{2} \times \mu \times C_0 \times \frac{W}{L} \times (V_a - V_{Ta})^2 \times \left\{1 + \lambda \times \left(Vd - \frac{V_T}{2}\right)\right\}$$

If the formulas (7), (9), (12) are substituted into the formula (10), the following formula (13) can be obtained.

[Formula 13] (13)
$$f \approx \frac{1}{6 \times CD \times R_{ref}}$$

As shown in the formula (13), the oscillating frequency of the ring oscillator circuit 410 is kept constant without being affected by λ or $V_T$. In fact, certain oscillating frequency can be obtained even when the source-drain voltage of the upper transistors 1a, 2a, 3a or the gate-source voltage of the upper transistors 1a, 2a, 3a changes.

Figure 11:
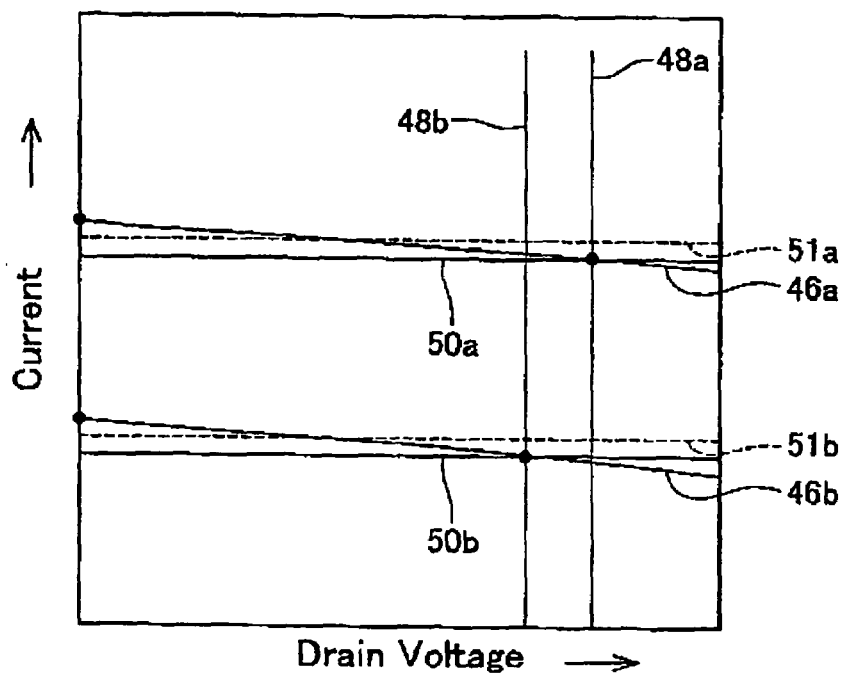
FIG. 11 shows a relationship between drain voltage and current when environmental temperature is changed, in the clock signal output circuit of Embodiment 1.

The graph shown in FIG. 11 shows a value of the current flowing through the upper transistors 1a, 2a, 3a when the environmental temperature is changed in the case of using the ring oscillator circuit 10. The direct power source 12 of the ring oscillator circuit 10 is 4.5 volts. The vertical axis of the graph represents a value of the current flowing through the upper transistors 1a, 2a, 3a, while the horizontal axis represents the drain voltage of the upper transistors 1a, 2a, 3a. A curve 46a shows change in the current flowing through the upper transistors 1a, 2a, 3a when the environmental temperature is −40° C. A curve 46b shows change in the current flowing through the upper transistors 1a, 2a, 3a when the environmental temperature is 160° C. A straight line 48a shows the threshold voltage $V_T$ of the lower transistors 1b, 2b, 3b when the environmental temperature is −40° C. A straight line 48b shows the threshold voltage $V_T$ of the lower transistors 1b, 2b, 3b when the environmental temperature is 160° C. A straight line 50a shows the current flowing through the upper transistor 4a when the environmental temperature is −40° C. A straight line 50b shows the current flowing through the upper transistor 4a when the environmental temperature is 160° C. A straight line 51a shows an average of the current flowing through the upper transistors 1a, 2a, 3a while the drain voltage of the upper transistors 1a, 2a, 3a changes from 0 volt to $V_T$ volts when the environmental temperature is −40° C. A straight line 51b shows an average of the current flowing through the upper transistors 1a, 2a, 3a while the drain voltage changes from 0 volt to $V_T$ volt when the environmental temperate is 160° C.

As can be seen clearly from FIG. 11, when the drain voltage of the upper transistors 1a, 2a, 3a is $V_T$ volts, the current flowing through the upper transistors 1a, 2a, 3a matches that flowing through the transistor 4a even if the environmental temperature changes. However, while the drain voltage of the upper transistors 1a, 2a, 3a changes from 0 volt to $V_T$ volts, there will be a difference between an average of the current flowing through the upper transistors 1a, 2a, 3a and the current flowing through the transistor 4a. In this embodiment, an average of the current flowing through the upper transistors 1a, 2a, 3a almost equals to a difference in the current flowing through the transistor 4a while the drain voltage of the upper transistors 1a, 2a, 3a changes from 0 volt to $V_T$ volts, regardless of whether the environmental temperature is −40° C. or 160° C. If the difference between the average of the current flowing through the upper transistors 1a, 2a, 3a while the drain voltage of the upper transistors 1a, 2a, 3a changes from 0 volt to $V_T$ volts and the current flowing through the upper transistor 4a is kept constant even when the environmental temperature changes, timing of when the gates of the lower transistors 1b, 2b, 3b are turned on will be steady. However, the difference between the average of the current flowing through the upper transistors 1a, 2a, 3a while the drain voltage of the upper transistors 1a, 2a, 3a changes from 0 volt to $V_T$ volts and the current flowing through the upper transistor 4a will change due to the environmental temperature. In fact, when the environmental temperature changes, timing when the gates of the lower transistors 1b, 2b, 3b are turned on will change. A change in the environmental temperature brings about a change in the oscillating frequency of the ring oscillator circuit 10.

Figure 12:
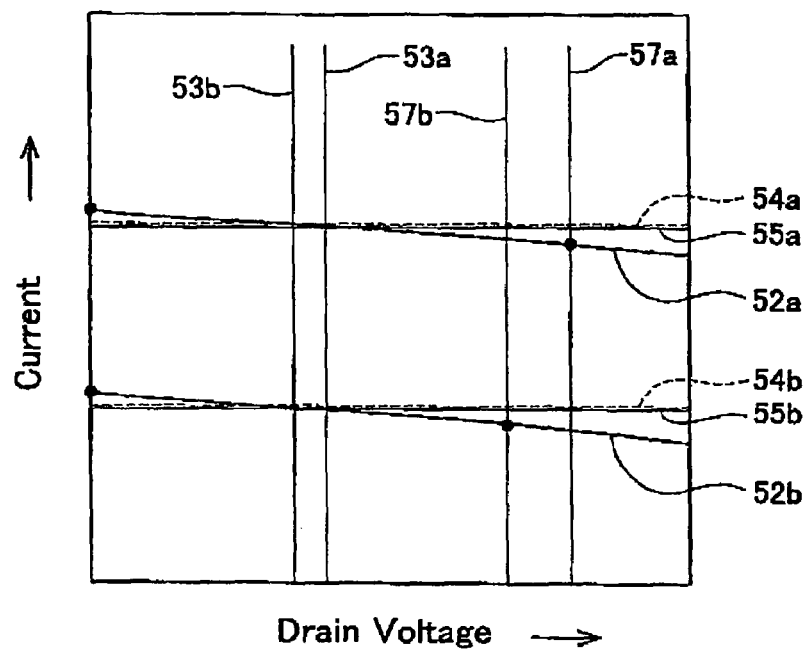
FIG. 12 shows a relationship between drain voltage and current when environmental temperature is changed, in the clock signal output circuit of Embodiment 5.

The graph shown in FIG. 12 shows a value of the current flowing through the upper transistors 1a, 2a, 3a when the environmental temperature is changed in the case of using the ring oscillator circuit 410. The direct power source 12 of the ring oscillator circuit 410 is 4.5 volts. The vertical axis of the graph represents a value of the current flowing through the upper transistors 1a, 2a, 3a, while the horizontal axis represents the drain voltage of the upper transistors 1a, 2a, 3a. A curve 52a shows change in the current flowing through the upper transistors 1a, 2a, 3a when the environmental temperature is −40° C. A curve 52b shows change in the current flowing through the upper transistors 1a, 2a, 3a when the environmental temperature is 160° C. A straight line 53a shows one-half of threshold voltage $V_T$ of the lower transistors 1b, 2b, 3b when the environmental temperature is −40° C.

A straight line 53b shows one-half of the threshold voltage $V_T$ of the lower transistors 1b, 2b, 3b when the environmental temperature is 160° C. A straight line 55a shows the current flowing through the upper transistor 4a when the environmental temperature is −40° C. A straight line 55b shows the current flowing through the upper transistor 4a when the environmental temperature is 160° C. A straight line 54a shows an average of the current flowing through the upper transistors 1a, 2a, 3a while the drain voltage of the upper transistors 1a, 2a, 3a changes from 0 volt to $V_T$ volts when the environmental temperature is −40° C. A straight line 54b is an average of the current flowing the upper transistors 1a, 2a, 3a while the drain voltage of the upper transistors 1a, 2a, 3a changes from 0 volt to $V_T$ volts when the environmental temperature is 160° C. A straight line 57a shows the threshold voltage $V_T$ of the lower transistors 1b, 2b, 3b when the environmental temperature is −40° C. A straight line 57b shows the threshold voltage $V_T$ of the lower transistors 1b, 2b, 3b when the environmental temperature is 160° C.

As can be seen clearly from FIG. 12, the current flowing through the upper transistors 1a, 2a, 3a matches that flowing through the upper transistor 4a even when the environmental temperature changes, when the drain voltage of the upper transistors 1a, 2a, 3a is $\frac{1}{2}V_T$. An average of the current flowing through the upper transistors 1a, 2a, 3a while the drain voltage of the upper transistors 1a, 2a, 3a changes from 0 volt to $V_T$ volts hardly differs from the current flowing through the upper transistor 4a. This is because the current flowing through the upper transistors 1a, 2a, 3a when the drain voltage of the upper transistors 1a, 2a, 3a changes from 0 volt to $V_T$ volts changes almost linearly. The difference between the average of the current flowing through the upper transistors 1a, 2a, 3a and that flowing through the upper transistor 4a can be remarkably controlled even when the environmental temperature changes. In fact, even when the environmental temperature changes, the timing when the gates of the lower transistors 1b, 2b, 3b are turned on will be steady. In the ring oscillator circuit 410, the oscillating frequency can be remarkably stabilized even when the environmental temperature changes.

Figure 13:
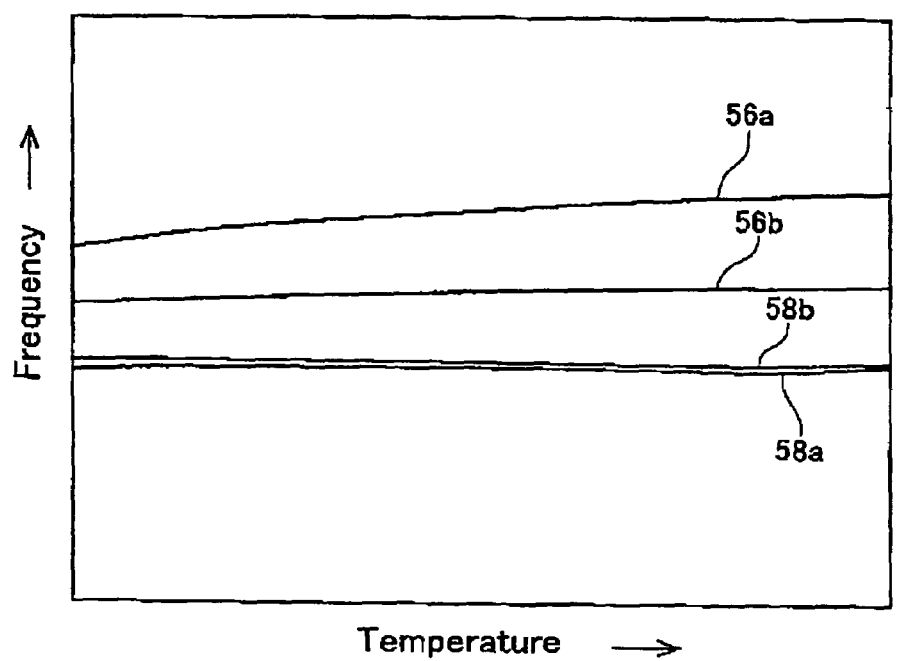
FIG. 13 shows a relationship between the oscillating frequency and the environmental temperature, and the oscillating frequency and the supply voltage.

FIG. 13 shows a relationship between the oscillating frequency of the ring oscillator circuits 10 and 410 and the environmental temperature. The vertical axis represents the oscillating frequency, while the horizontal axis represents the environmental temperature. A curve 56a shows the oscillating frequency when the direct power source 12 of the ring oscillator circuit 10 is 4V. A curve 56b shows the oscillating frequency when the direct power source 12 of the ring oscillator circuit 10 is 5V. A curve 58a shows the oscillating frequency when the direct power source 12 of the ring oscillator circuit 410 is 4V. A curve 58b is the oscillating frequency when the direct power source 12 of the ring oscillator circuit 410 is 5V.

As can be seen clearly from FIG. 13, the oscillating frequency of the ring oscillator circuit 10 slightly changes when the environmental temperature changes. This phenomenon is a common event although there may be some difference depending on voltage of the direct power source 12. In the ring oscillator circuit 410, even the environmental temperature changes, the oscillating frequency is almost constant. This phenomenon is a common event that does not depend on variation in the voltage of the direct power source 12. In addition, the oscillating frequency of the ring oscillator circuit 10 slightly changes if the voltage of the direct power source 12 changes. This phenomenon can be seen saliently when the environmental temperature is high. Compared with the ring oscillator circuit 10, any variation in the oscillating frequency can be controlled more remarkably in the ring oscillator circuit 410 even when the voltage of the direct power source 12 varies.

EMBODIMENT 6

Figure 9:
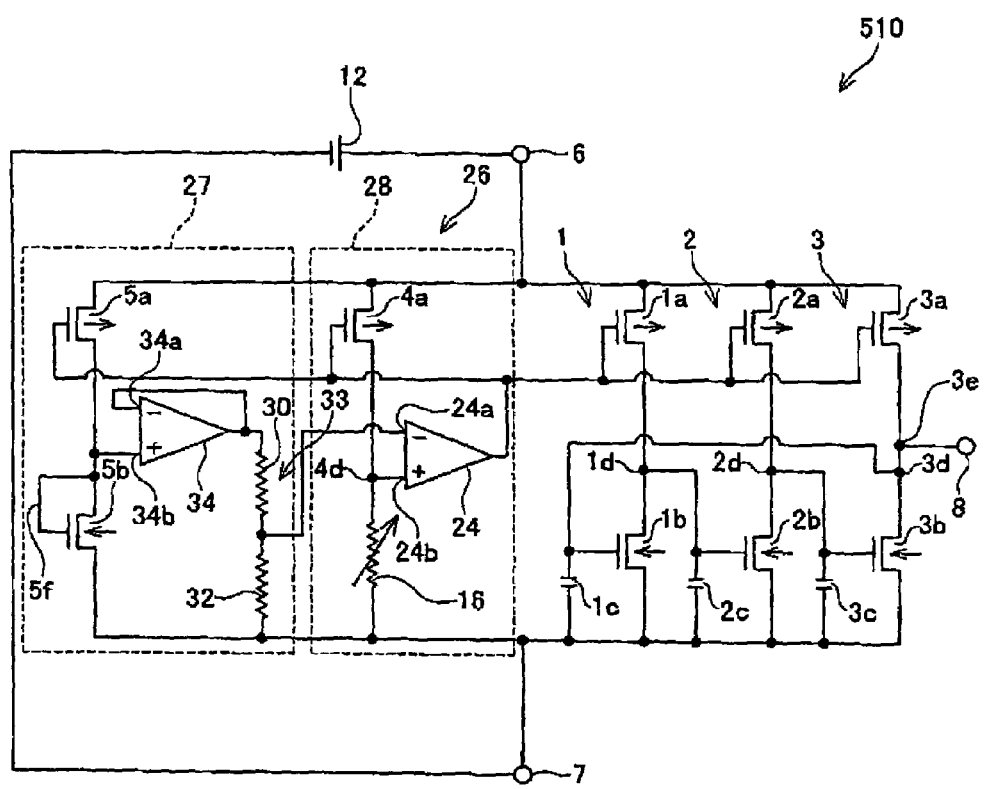
FIG. 9 shows a clock signal output circuit of Embodiment 6.

A ring oscillator circuit 510 shown in FIG. 9 is a variant example of the ring oscillator circuit 410 and is a clock signal output circuit for generating clock signal with reference to negative voltage. In configuration substantially identical to the ring oscillator circuit 410, same components are assigned with same reference numbers, and the overlapping description thereof is omitted.

Between a midpoint of an upper transistor 5a and a lower transistor 5b and a voltage conversion circuit 33 is connected an additional amplifier 34. A non-inverted input terminal 34b of the additional operational amplifier 34 is connected to a midpoint of the upper transistor 5a and the lower transistor 5b of the additional pair of transistors. An inverted input terminal 34a of the additional operational amplifier 34 is connected to an output terminal of the additional operational amplifier 34. The output terminal of the additional operational amplifier 34 is connected to the voltage conversion circuit 33. In fact, the additional operational amplifier 34 serves as a voltage follower. As the additional operational amplifier 34 is added, the threshold voltage $V_T$ of the lower transistor 5b can be directly outputted to the voltage conversion circuit 33. In the ring oscillator circuit 410 in which the additional operational amplifier 34 is not connected, the current flowing through the upper transistor 5a diverts to the lower transistor 5b and the voltage conversion circuit 33. Voltage to be inputted into the operational amplifier 24 will be smaller than one-half of the threshold voltage $V_T$ of the lower transistor 5b. The current flowing through the upper transistors 1a, 2a, 3a can no longer be equalized when the drain voltage of the upper transistors 1a, 2a, 3a is $V_T/2$ volts, if the supply voltage of the direct power source 12 differs. This phenomenon will be more saliently as the current flowing through the upper transistor 5a is smaller.

While specific examples of the present invention have been described in detail above, these are merely given by way of example and do not restrict the scope of the patent claims. The technology described in the patent claims includes the specific examples given above modified and altered in various ways.

In the embodiment 5, a voltage conversion circuit has been added to the ring oscillator circuit with reference to negative voltage shown in the embodiment 1. However, the voltage conversion circuit can be added to the ring oscillator circuit with reference to positive voltage as shown in the embodiment 2. In that case, the voltage conversion circuit may be connected between a midpoint of the upper and lower transistors of the threshold voltage generation circuit and the first terminal, and a midpoint of resistances of the voltage conversion circuit may be connected to a non-inverted input terminal of the operational amplifier. Similarly, the embodiment 6 may also be a ring oscillator circuit with reference to the positive supply voltage.

In the embodiment 5, we described the case in which resistance values of the first and second resistances are equal. However, the resistance values of the first and second resistances do not have to be equal. In fact, it would be enough if the threshold voltage of the lower transistor of the additional pair of transistors could be divided to one-$m^{th}$ (m>1).

In addition, the technical elements illustrated in this specification and the figures shall show the technological usefulness alone or through various types of combinations, and shall not be limited to the combinations described in the claims when application was filed. In addition, the technology illustrated in this specification or drawings shall be able to more than one object simultaneously, and achievement of any one of the objects shall have the technological usefulness.

What is claimed is:

1. A circuit for outputting a clock signal with a predetermined frequency regardless of voltage variation and temperature variation, comprising:

a first terminal to be connected to an electrode of a direct power source;

a second terminal to be connected to another electrode of the direct power source;

a third terminal for outputting the clock signal;

a parallel circuit comprising $1^{st}$ to $n^{th}$ pairs of transistors and capacitors, wherein each pair of transistors comprises an upper transistor and a lower transistor connected in series between the first terminal and the second terminal, the number "n" of the pair of transistors is odd, a point between the upper transistor and the lower transistor of each pair of transistors is connected to a gate of the lower transistor of the pair of transistors subsequent to the preceding pair of transistors, and a point between the upper transistor and the lower transistor of one of the pairs of transistors is connected to the third terminal, wherein each pair of transistors having a number lower than n precedes the pair of transistors subsequent to the pair of transistors having the number lower than n and having a higher number than the pair of transistors having the number lower than n, and the $n^{th}$ pair of transistors precedes the $1^{st}$ pair of transistors, a capacitor is inserted between the gate of the lower transistor of each pair of transistors and the second terminal, the upper transistors have the same specification, the lower transistors have the same specification, and the capacitors have the same specification, and a current regulating circuit is connected to the gates of the upper transistors of the pairs of transistors, wherein the current regulator supplies a gate voltage to each gate of each upper transistor of the pairs of transistors, the magnitude of the gate voltage being adjusted to cause a magnitude of current to flow between the source and drain of an upper transistor from amongst the upper transistors of the pairs of transistors, and the magnitude of the current between the source and drain of the upper transistor being proportional to a voltage between the source and gate of the lower transistor from the pair of transistors including the upper transistor when the lower transistor is turned on, the current regulating circuit comprising:

a threshold voltage generation circuit, circuit that comprises an additional pair of transistors, wherein the additional pair of transistors has an upper transistor and a lower transistor connected in series between the first terminal and the second terminal, the drain and the gate of the lower transistor of the additional pair of transistors are connected, and the threshold voltage generation circuit outputs a magnitude of a voltage proportional to the voltage between the gate and source of the lower transistor when the lower transistor is turned on; and a bias voltage generation circuit, that comprises a series circuit and an operational amplifier, wherein the series circuit is connected between the first terminal and the second terminal, and comprises an upper transistor and a resistance, a point between the upper transistor and the resistance of the series circuit is connected to a non-inverted input terminal of the operational amplifier, and the output terminal of the operational amplifier is connected to the gates of all the upper transistors of the series circuit and the pairs of transistors, and a voltage conversion circuit, wherein the voltage conversion circuit divides a magnitude of a voltage of a point between the upper transistor and the lower transistor of the additional pair of transistors to one-$m^{th}$, wherein the "m" satisfies the relationship of m>1, and a magnitude of the voltage divided to one-$m^{th}$ is inputted into an input terminal of the bias voltage generation circuit, and wherein an output terminal of the threshold voltage generation circuit is connected to an input terminal of the bias voltage generation circuit, and the bias voltage generation circuit outputs the magnitude of the gate voltage for causing the current to pass through the upper transistor where the current is proportional to the voltage between the source and gate of the lower transistor when the lower transistor is turned on.

2. The circuit as defined in claim 1, wherein m=2.

3. The circuit as defined in claim 1, wherein
the threshold voltage generation circuit comprises an additional operational amplifier;
the additional operational amplifier is connected between the additional pair of transistors and the voltage conversion circuit;
the additional operational amplifier comprises a non-inverted input terminal, an inverted input terminal and an output terminal;
the non-inverted input terminal of the additional operational amplifier is connected to a point between the upper transistor and the lower transistor of the additional pair of transistors;
the inverted input terminal of the additional operational amplifier is connected to the output terminal of the additional operational amplifier; and
the output terminal of the additional operational amplifier is connected to the voltage conversion circuit.

4. The circuit as defined in claim 1, wherein:
the first terminal is connected to a high voltage side of a direct power source;
the second terminal is connected to a low voltage side of the direct power source;
the upper transistors are p-type transistors;
the lower transistors are n-type transistors;
the sources of the p-type transistors are connected to the first terminal;
the drains of the p-type transistors are connected to the drains of the n-type transistors; and
the sources of the n-type transistors are connected to the second terminal.

5. The circuit as defined in claim 1, wherein:
the first terminal is connected to a low voltage side of a direct power source;
the second terminal is connected to a high voltage side of the direct power source;
the upper transistors are the n-type transistors;
the lower transistors are the p-type transistors;
the sources of the n-type transistors are connected to the first terminal;
the drains of the n-type transistors are connected to the drains of the p-type transistors; and
the sources of the p-type transistors are connected to the second terminal.

6. The circuit as defined in claim 1, wherein
the upper transistors are p-type transistors and the lower transistors are n-type transistors, or
the upper transistors are n-type transistors and the lower transistors are p-type transistors.

* * * * *

UNITED STATES PATENT AND TRADEMARK OFFICE
CERTIFICATE OF CORRECTION

PATENT NO. : 7,560,998 B2
APPLICATION NO. : 11/604198
DATED : July 14, 2009
INVENTOR(S) : Norikazu Ohta et al.

Page 1 of 1

It is certified that error appears in the above-identified patent and that said Letters Patent is hereby corrected as shown below:

On the cover page,

Change

"(73) Assignees: Kabushiki Kaisha Toyoto Chuo Kenkyusho, Aichi-Gun (JP);
                 Denso Corporation, Kariya (JP)"

to

--(73) Assignees: Kabushiki Kaisha Toyota Chuo Kenkyusho, Aichi-Gun (JP);
                  Denso Corporation, Kariya (JP)--.

Col. 22, line 53, change "circuit, circuit" to --circuit--.

Signed and Sealed this

Twenty-ninth Day of September, 2009

David J. Kappos
*Director of the United States Patent and Trademark Office*